US009725618B2

(12) United States Patent
Nakajima et al.

(10) Patent No.: US 9,725,618 B2
(45) Date of Patent: Aug. 8, 2017

(54) METAL-CONTAINING RESIST UNDERLAYER FILM-FORMING COMPOSITION CONTAINING POLYACID

(71) Applicant: NISSAN CHEMICAL INDUSTRIES, LTD., Tokyo (JP)

(72) Inventors: Makoto Nakajima, Toyama (JP); Wataru Shibayama, Toyama (JP); Hiroyuki Wakayama, Toyama (JP); Satoshi Takeda, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/027,311

(22) PCT Filed: Oct. 3, 2014

(86) PCT No.: PCT/JP2014/076574
§ 371 (c)(1),
(2) Date: Apr. 5, 2016

(87) PCT Pub. No.: WO2015/053194
PCT Pub. Date: Apr. 16, 2015

(65) Prior Publication Data
US 2016/0251546 A1 Sep. 1, 2016

(30) Foreign Application Priority Data
Oct. 7, 2013 (JP) ................ 2013-210103

(51) Int. Cl.
C09D 183/04 (2006.01)
G03F 7/11 (2006.01)
C09D 183/08 (2006.01)
C08G 77/26 (2006.01)
C08L 83/04 (2006.01)
(Continued)

(52) U.S. Cl.
CPC .......... C09D 183/04 (2013.01); C08G 77/06 (2013.01); C08G 77/26 (2013.01); C08G 77/58 (2013.01); C08G 77/80 (2013.01); C08L 83/04 (2013.01); C08L 85/00 (2013.01); C09D 1/00 (2013.01); C09D 5/00 (2013.01); C09D 5/006 (2013.01); C09D 7/1216 (2013.01); C09D 183/08 (2013.01); C09D 183/14 (2013.01); G03F 7/0752 (2013.01); G03F 7/091 (2013.01); G03F 7/094 (2013.01); G03F 7/11 (2013.01); G03F 7/168 (2013.01); G03F 7/20 (2013.01); G03F 7/32 (2013.01); H01L 21/0271 (2013.01); H01L 21/0332 (2013.01); H01L 21/0335 (2013.01); H01L 21/0337 (2013.01); H01L 21/0338 (2013.01); C08G 77/04 (2013.01); C08K 3/24 (2013.01)

(58) Field of Classification Search
CPC ...... C09D 183/04; C09D 5/00; C09D 7/1216; C09D 183/08; C09D 183/14; C08G 77/06; C08G 77/26; C08G 77/58; C08G 77/80; C08L 83/04; C08L 85/00; G03F 7/0752; G03F 7/091; G03F 7/094; G03F 7/11; G03F 7/168; G03F 7/20; G03F 7/32; H01L 21/0271; H01L 21/0332; H01L 21/0335; H01L 21/0337; H01L 21/0338
See application file for complete search history.

(56) References Cited

U.S. PATENT DOCUMENTS 3,847,857 A * 11/1974 Haag ................ C09D 15/00
521/28
2008/0026320 A1* 1/2008 Lee .................... C03C 8/22
430/270.1
(Continued)

FOREIGN PATENT DOCUMENTS

JP  S61-272930 A  12/1986
JP  2012-215877 A  11/2012
(Continued)

OTHER PUBLICATIONS

Dec. 22, 2014 International Search Report issued in International Patent Application No. PCT/JP2014/076574.
(Continued)

Primary Examiner — Duy Deo
(74) Attorney, Agent, or Firm — Oliff PLC

(57) ABSTRACT

A resist underlayer film-forming composition including: (A) component: an isopoly or heteropoly acid, or a salt thereof, or a combination thereof; and (B) component: polysiloxan, poly hafnium oxide or zirconium oxide, or a combination thereof, wherein an amount of the (A) component is 0.1 to 85% by mass of a total amount of the (A) component and the (B) component; and polysiloxan is a hydrolysis-condensation product of hydrolyzable silane of Formula (1):

$$R^1_a R^2_b Si(R^3)_{4-(a+b)} \quad \text{Formula (1)}$$

and a hydrolyzable silane whose (a+b) is 0 is contained in a proportion of 60 to 85 mol % of a total hydrolyzable silane in Formula (1); the poly hafnium oxide is a hydrolysis-condensation product of hydrolyzable hafnium of Formula (2):

$$Hf(R^4)_4 \quad \text{Formula (2)}$$

and the zirconium oxide is a hydrolysis-condensation product of hydrolyzable zirconium of Formula (3) or Formula (4):

$$Zr(R^5)_4 \quad \text{Formula (3)}$$

$$ZrO(R^6)_2 \quad \text{Formula (4)}$$

or a hydrolysis-condensation product of a combination thereof.

9 Claims, No Drawings

| (51) | Int. Cl. | |
|---|---|---|
| | C08L 85/00 | (2006.01) |
| | C08G 77/00 | (2006.01) |
| | H01L 21/027 | (2006.01) |
| | G03F 7/075 | (2006.01) |
| | G03F 7/09 | (2006.01) |
| | C08G 77/06 | (2006.01) |
| | C08G 77/58 | (2006.01) |
| | C09D 5/00 | (2006.01) |
| | C09D 7/12 | (2006.01) |
| | C09D 183/14 | (2006.01) |
| | G03F 7/16 | (2006.01) |
| | G03F 7/20 | (2006.01) |
| | G03F 7/32 | (2006.01) |
| | H01L 21/033 | (2006.01) |
| | C09D 1/00 | (2006.01) |
| | C08G 77/04 | (2006.01) |
| | C08K 3/24 | (2006.01) |

(56) References Cited

U.S. PATENT DOCUMENTS

| 2011/0293896 A1* | 12/2011 | Sugasaki | C08G 18/289 |
| | | | 428/195.1 |
| 2012/0223418 A1 | 9/2012 | Stowers et al. | |
| 2014/0356792 A1 | 12/2014 | Noya | |

FOREIGN PATENT DOCUMENTS

| JP | 2013-023407 A | 2/2013 |
| JP | 2013-040993 A | 2/2013 |
| JP | 2013-083963 A | 5/2013 |
| JP | 2014-137546 A | 7/2014 |

OTHER PUBLICATIONS

Dec. 22, 2014 Written Opinion issued in International Patent Application No. PCT/JP2014/076574.

* cited by examiner

METAL-CONTAINING RESIST UNDERLAYER FILM-FORMING COMPOSITION CONTAINING POLYACID

TECHNICAL FIELD

The present invention relates to a composition for forming an underlayer film between a substrate and a resist (for example, a photoresist, an electron beam resist, and an EUV resist) for use in the manufacturing of a semiconductor device.

BACKGROUND ART

Conventionally, microfabrication has been carried out by lithography using a photoresist in the production of semiconductor devices. The microfabrication is a processing method including forming a thin film of a photoresist on a semiconductor substrate such as a silicon wafer, irradiating the thin film with active light such as ultraviolet rays through a mask pattern on which a pattern of a semiconductor device is depicted, developing the pattern, and etching the substrate by using the obtained photoresist pattern as protection films, so that fine concavity and convexity, which correspond to the pattern, is formed on the surface of the substrate. In recent years, however, semiconductor devices tend to be further integrated, and the active light to be used has had a shorter wavelength from a KrF excimer laser (248 nm) to an ArF excimer laser (193 nm). This raises serious problems of the effects of reflection of active light from the semiconductor substrate. Thus, lithography of multilayer resist process using hardmasks has been carried out.

As a resist underlayer film containing a metal other than silicon, use of a compound obtained by mixing metal alkoxy that contains metal, such as tungsten, zinc, aluminum, and indium, and silicon alkoxide; and then hydrolyzing the mixture for an inorganic film for a multilayer resist process, is disclosed (see Patent Document 1).

A metal oxide film containing single metal, such as zirconium, molybdenum, and hafnium; metal oxoacid, metal oxide, metal hydroxide, metal alkoxide, metal halide, and metal oxyhalide is disclosed (see Patent Document 2).

A composition for forming tungsten oxide films containing water soluble metatungstate and at least one additive selected from anionic polymers, nonionic polymers, anionic surfactants, and nonionic surfactants containing tertiary amino groups, is disclosed (see Patent Document 3).

A method for forming patterns, in which a silicon-containing film is formed on the top surface of a substrate to be processed by using a polysiloxan composition, and by adding an acid, a base, a metal complex, a metal salt compound, and an onium salt compound is disclosed. As the acid, hydrochloric acid, nitric acid, sulfuric acid, sulfurous acid, hydrosulfuric acid, perchloric acid, hydrogen peroxide, carbonic acid, formic acid, acetic acid, benzenesulfonic acid, phosphoric acid, heteropoly acid, an inorganic solid acid, and the like are disclosed (see Patent Document 4).

PRIOR ART DOCUMENTS

Patent Documents

Patent Document 1: Japanese Patent Application Publication No. 2012-215877 (JP 2012-215877 A)
Patent Document 2: Japanese Patent Application Publication No. 2013-023407 (JP 2013-023407 A)
Patent Document 3: Japanese Patent Application Publication No. 2013-040993 (JP 2013-040993 A)
Patent Document 4: Japanese Patent Application Publication No, 2013-083963 (JP 2013-083963 A)

SUMMARY OF THE INVENTION

Problem to be Solved by the Invention

An object of the present invention is to provide a thin film (underlayer film)-forming composition used with a resist (a photoresist, an electron beam resist, and an EUV resist) in a lithography process that can be used in the manufacturing of a semiconductor device. More specifically, an object of the present invention is to provide a resist underlayer film-forming composition for lithography to form a resist underlayer film that can be used as a hardmask. Further, an object of the present invention is to provide a resist underlayer film-forming composition for lithography to form a resist underlayer film that can be used as an anti-reflective coating. Further, an object of the present invention is to provide a resist underlayer film for lithography, which does not intermix with a resist, and has a larger dry etching rate than that of a resist; and a resist underlayer film-forming composition to form the underlayer film.

In addition, an object of the present invention is to provide an underlayer film (a hardmask) for an EUV resist, which is a thin film that is present in an underlayer of an EUV resist; and an underlayer film-forming composition for a resist that is used for solvent development. Further, an object of the present invention is to provide a reverse material.

Means for Solving the Problem

The present invention provides, as a first aspect, a resist underlayer film-forming composition containing (A) component: an isopoly acid or a heteropoly acid, or a salt thereof, or a combination thereof and (B) component: polysiloxan, poly hafnium oxide or zirconium oxide, or a combination thereof, wherein an amount of the (A) component is 0.1 to 85% by mass of a total amount of the (A) component and the (B) component; and the polysiloxan is a hydrolysis-condensation product of hydrolyzable silane of Formula (1):

wherein Formula (1), $R^1$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and $R^1$ binds to a silicon atom with a Si—C bond; $R^2$ is a nitrogen atom-containing ring or an organic group containing the nitrogen atom-containing ring, a condensed aromatic ring or an organic group containing the condensed aromatic ring, a protected phenolic hydroxyl group or an organic group containing the protected phenolic hydroxyl group, or a bisaryl group or an organic group containing the bisaryl group, and $R^2$ binds to a silicon atom with a Si—C bond; $R^3$ is an alkoxy group, an acyloxy group, or a halogen group; a is an integer of 0 to 3; b is an integer of 0 to 3; (a+b) is an integer of 0 to 3); and a hydrolyzable silane whose (a+b) is 0 is contained in a proportion of 60 to 85 mol % of a total hydrolyzable silane in Formula (1);

the poly hafnium oxide is a hydrolysis-condensation product of hydrolyzable hafnium of Formula (2):

wherein $R^4$ is an alkoxy group, an acyloxy group, or a halogen group; and the zirconium oxide is a hydrolysis-condensation product of hydrolyzable zirconium of Formula (3) or Formula (4):

$$Zr(R^5)_4 \quad \text{Formula (3)}$$

$$ZrO(R^6)_2 \quad \text{Formula (4)}$$

wherein each of $R^5$ and $R^6$ is an alkoxy group, an acyloxy group, a halogen group, or a nitrate ion, or a hydrolysis-condensation product of a combination thereof;

as a second aspect, the resist underlayer film-forming composition as described in the first aspect, wherein the isopoly acid is an oxoacid of tungsten, molybdenum, or vanadium, or a salt thereof;

as a third aspect, the resist underlayer film-forming composition as described in the first aspect, wherein the isopoly acid is metatungstic acid or ammonium metatungstate;

as a fourth aspect, the resist underlayer film-forming composition as described in the first aspect wherein the heteropoly acid is a combination of an oxoacid of tungsten, molybdenum, or vanadium, or a salt thereof and an oxoacid of silicon or phosphorus, or a salt thereof;

as a fifth aspect, the resist underlayer film-forming composition as described in the first aspect, wherein the heteropoly acid is silicotungstic acid, phosphotungstic acid, or phosphomolybdic acid;

as a sixth aspect, the resist underlayer film-forming composition as described in any one of the first aspect to the fifth aspect, further containing an acid;

as a seventh aspect, the resist underlayer film-forming composition as described in any one of the first aspect to the sixth aspect, further containing water;

as an eighth aspect, a resist underlayer film obtained by applying the resist underlayer film-forming composition as described in any one of the first aspect to the seventh aspect onto a semiconductor substrate, and then baking the applied resist underlayer film-forming composition;

as a ninth aspect, a method for manufacturing a semiconductor device comprising steps of: forming a resist underlayer film by applying the resist underlayer film-forming composition as described in any one of the first aspect to the seventh aspect onto a semiconductor substrate, and then baking the applied resist underlayer film-forming composition; forming a resist film by applying a composition for resists onto the resist underlayer film; exposing the resist film; obtaining a resist pattern by developing the exposed resist film; etching the resist underlayer film with the resist pattern; and processing the semiconductor substrate with a patterned resist underlayer film; and as a tenth aspect, a method for manufacturing a semiconductor device comprising steps of: forming an organic underlayer film on a semiconductor substrate; forming a resist underlayer film by applying the resist underlayer film-forming composition as described in any one of the first aspect to the seventh aspect onto the organic underlayer film, and then baking the applied resist underlayer film-forming composition; forming a resist film by applying a composition for resists onto the resist underlayer film; exposing the resist film; obtaining a resist pattern by developing the exposed resist film; etching the resist underlayer film with the resist pattern; etching the organic underlayer film with the patterned resist underlayer film; and processing the semiconductor substrate with the patterned organic underlayer film.

Effects of the Invention

In the present invention, the thin film (underlayer film) is formed by an application of a resist underlayer film-forming composition of the present invention on a substrate, or is formed by application on an organic underlayer film formed on the substrate, and then a resist film (for example, a photoresist, an electron beam resist, and an EUV resist) is formed on the thin film. After that, a resist pattern is formed by exposure followed by development, and the thin film is dry etched by using the resist pattern to transfer the pattern, and a substrate is processed with the pattern, or the organic underlayer film is etched to transfer the pattern, and a substrate is processed with the organic underlayer film.

To form a fine pattern, a resist tends to be a thinner film to prevent collapse of the pattern. When a resist is such a thin film, the etching rate of the film that is present under the resist film should be higher than that of the resist film, otherwise a pattern cannot be transferred on the film under the resist film by dry etching.

In the present invention, a substrate is coated with a thin film according to a composition of the present invention directly, or via an organic underlayer film, and the coated substrate is further coated with a resist film (an organic resist film).

Depending on the selection of an etching gas, the dry etching rate between a film having an organic component and a film having an inorganic component is largely different. The dry etching rate of a film having an organic component increases by using an oxygen-containing gas, while the dry etching rate of a film having an inorganic component increases by using a halogen-containing gas.

The resist underlayer film-forming composition of the present invention is for a film of inorganic components. Therefore, for example, after a resist pattern is formed, the thin film of the present invention, which is present under the resist film, is dry etched with a halogen-containing gas to transfer the pattern onto the thin film, and a substrate can be processed by using the pattern transferred to the thin film, with a halogen-containing gas. Alternatively, an organic underlayer film, which is present under the thin film, is dry etched by using the thin film on which the pattern has been transferred, with an oxygen-containing gas to transfer the pattern onto the organic underlayer film, and a substrate can be processed by using the organic underlayer film on which the pattern has been transferred, with a halogen-containing gas.

A resist underlayer film obtained from a resist underlayer film-forming composition of the present invention is sufficiently functional as a hardmask that prevents reflection.

As a hardmask, the resist underlayer film of the present invention that is an inorganic polymer (an intermediate film) is useful for etching of an organic underlayer film that is present under the resist underlayer film, and for processing (etching) of a substrate. That is, the resist underlayer film is sufficiently resistant for dry etching to process a substrate, and for dry etching of an organic underlayer film using an oxygen-containing dry etching gas.

Thus, the thin film according to the resist underlayer film-forming composition of the present invention has an improved dry etching rate to these top layer resists, and is resistant for dry etching when substrates are processed.

Further, the thin film-forming composition of the present invention can be used as the underlayer film of an EUV resist, and as the underlayer anti-reflective coating of an EUV resist, which prevents reflection of exposure light undesirable at the time of EUV exposure, such as UV and DUV described above, from a substrate or an interface without intermixing with the EUV resist. The obtained thin film can efficiently prevent reflection on the underlayer of an EUV resist.

A resist underlayer film-forming composition of the present invention can be used as a reverse material by selecting a solvent that does not dissolve a resist. To use the resist underlayer film-forming composition as the reverse material, firstly, a resist pattern formed on a substrate is coated with a resist underlayer film-forming composition of the present invention, and the composition is dried to form a thin film. Then, the formed thin film is etched back to expose the surface of the resist pattern, and dry etched with a gas that selectively removes the resist (for example, an oxygen-containing gas) such that only the layer of the thin film remains. As a result, the pattern will be reversed.

MODES FOR CARRYING OUT THE INVENTION

The present invention is a resist underlayer film-forming composition containing an (A) component: an isopoly acid or a heteropoly acid, or a salt thereof, or a combination thereof and a (B) component: polysiloxan, poly hafnium oxide or zirconium oxide, or a combination thereof, in which an amount of the (A) component is 0.1 to 85% by mass of a total amount of the (A) component and the (B) component; in which the polysiloxan is a hydrolysis-condensation product of hydrolyzable silane of Formula (1), and in Formula (1), a hydrolyzable silane whose (a+b) is 0 accounts for 60 to 85 mol % of a total hydrolyzable silane; the poly hafnium oxide is a hydrolysis-condensation product of hydrolyzable hafnium of Formula (2); and the zirconium oxide is a hydrolysis-condensation product of hydrolyzable zirconium of Formula (3) or Formula (4) or a hydrolysis-condensation product of a combination thereof.

The isopoly acid used in the (A) component of the present invention is an oxoacid of tungsten, molybdenum, or vanadium, or a salt thereof. As the salt, although alkali metal (Na, K, and Li) can be used, an ammonium salt can preferably be used. Examples of the ammonium salt include ammonium ($NH_4$), primary ammonium, secondary ammonium, tertiary ammonium, and quaternary ammonium, and an example of an organic group thereof is a $C_{1-4}$ alkyl group. Among them, ammonium ($NH_4$) is preferred.

Examples of the isopoly acid include metatungstic acid, metamolybdic acid, metavanadic acid, ammonium metatungstate, ammonium metamolybdate, and ammonium metavanadate.

The heteropoly acid used in the (A) component is a combination of an oxoacid of tungsten, molybdenum, or vanadium, or a salt thereof and an oxoacid of silicon or phosphorus, or a salt thereof. As the salt, although alkali metal (Na, K, and Li) can be used, an ammonium salt can preferably be used. Examples of the ammonium salt include ammonium ($NH_4$), primary ammonium, secondary ammonium, tertiary ammonium, and quaternary ammonium, and an example of an organic group thereof is a $C_{1-4}$ alkyl group. Among them, ammonium ($NH_4$) is preferred.

Examples of the heteropoly acid include silicotungstic acid, silicomolybdic acid, silicovanadic acid, phosphotungstic acid, phosphomolybdic acid, phosphovanadic acid, ammonium silicotungstate, ammonium silicomolybdate, ammonium silicovanadate, ammonium phosphotungstate, ammonium phosphomolybdate, and ammonium phosphovanadate.

The polysiloxan used in the (B) component is a hydrolysis-condensation product of hydrolyzable silane of Formula (1) (polysiloxan), and in Formula (1), a hydrolyzable silane whose (a+b) is 0 contains 60 to 85 mol % of a total hydrolyzable silane.

$R^1$ in Formula (1) is a $C_{1-10}$ linear or branched alkyl group, and examples thereof include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The alkyl group may be a cyclic alkyl group, and examples of the $C_{1-10}$ cyclic alkyl group may include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl-group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the aryl group include a $C_{6-20}$ aryl group and examples of the $C_{6-20}$ aryl group may include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the alkenyl group include a $C_{2-10}$ alkenyl group and examples of the $C_{2-10}$ alkenyl group may include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the halogenated alkyl group and a halogenated aryl group include organic groups in which the groups of the above have been substituted with halogen atoms such as fluorine, chlorine, bromine, and iodine.

Examples of the organic group having an epoxy group include glycidoxymethyl group, glycidoxyethyl group, glycidoxypropyl group, glycidoxybutyl group, and epoxycyclohexyl group.

Examples of the organic group having an acryloyl group include acryloylmethyl group, acryloylethyl group, and acryloylpropyl group.

Examples of the organic group having a methacryloyl group include methacryloylmethyl group, methacryloylethyl group, and methacryloylpropyl group.

Examples of the organic group having a mercapto group include ethylmercapto group, butylmercapto group, hexylmercapto group, and octylmercapto group.

Examples of the organic group having an amino group include aminomethyl group, aminoethyl group, and aminopropyl group.

Examples of the organic group having a cyano group include cyanoethyl group and cyanopropyl group.

Examples of the organic group having a sulfonyl group include methylsulfonyl group, allylsulfonyl group, and phenylsulfonyl group.

Examples of the nitrogen atom-containing ring or an organic group containing the nitrogen atom-containing ring in $R^2$ include organic groups of Formula (5):

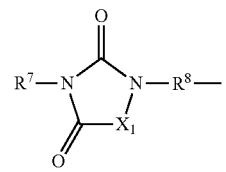

Formula (5)

(in Formula (5), $R^7$ is a hydrogen atom, or a $C_{1-10}$ alkyl group, an alkenyl group, an epoxy group, a sulfonyl group, or an organic group containing these; $R^8$ is a $C_{1-10}$ alkylene group, a hydroxyalkylene group, a sulfide group, an ether group, an ester group, or a combination thereof; and $X^1$ is represented by Formulae (5), (6), or (7):

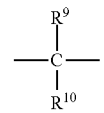

Formula (6)

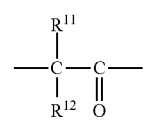

Formula (7)

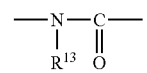

Formula (8)

(in Formulae (6), (7), and (8), each of $R^9$ to $R^{13}$ is a hydrogen atom, or a $C_{1-10}$ alkyl group, an alkenyl group, an epoxy group, a sulfonyl group, or an organic group containing these, and each of $R^9$ to $R^{13}$ can bind to a silicon atom with a Si—C bond).

The nitrogen atom-containing ring or an organic group containing the nitrogen atom-containing ring in $R^2$ can be an imidazole group or an organic group containing an imidazole group.

The condensed aromatic ring group or an organic group containing the condensed aromatic ring group in $R^2$ can be a naphthyl group or an anthryl group.

The protected phenolic hydroxyl group or an organic group containing the protected phenolic hydroxyl group in $R^2$ can be an alkoxyalkyl-substituted aryl group or an alkoxyalkoxyalkyl-substituted aryl group. A use of the protected phenolic hydroxyl group improves acidity, which results in an improved resist profile. Each of alkyl portions and alkoxy portions in these organic groups can be the alkyl groups or the alkoxy groups exemplified above or below.

The bisaryl group or an organic group containing the bisaryl group in $R^2$ can be a bisphenyl group.

Examples of the alkyl group, the aryl group, the alkenyl group, the halogenated alkyl group, the halogenated aryl group, the organic group having an epoxy group, the organic group having an acryloyl group, the organic group having a methacryloyl group, the organic group having a mercapto group, the organic group having an amino group, the organic group having a cyano group, and the organic group having a sulfonyl group of $R^7$ to $R^{13}$ are described in the examples of above.

Examples of the alkoxy group of $R^3$ include $C_{1-30}$, more preferably $C_{1-10}$ alkoxy groups, and specific examples include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2,-trimethyl-n-propoxy group, 1-ethyl-1-methyl-n-propoxy group, 1-ethyl-2-methyl-n-propoxy group, and phenoxy group.

Examples of the acyloxy group of $R^3$ include $C_{1-30}$, more preferably $C_{1-10}$ acyloxy groups, and specific examples include methylcarbonyloxy group, ethylcarbonyloxy group, n-propylcarbonyloxy group, i-propylcarbonyloxy group, cyclopropylcarbonyloxy group, n-butylcarbonyloxy group, i-butylcarbonyloxy group, s-butylcarbonyloxy group, t-butylcarbonyloxy group, cyclobutylcarbonyloxy group, 1-methyl-cyclopropylcarbonyloxy group, 2-methyl-cyclopropylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, cyclopentylcarbonyloxy group, 1-methyl-cyclobutylcarbonyloxy group, 2-methyl-cyclobutylcarbonyloxy group, 3-methyl-cyclobutylcarbonyloxy group, 1,2-dimethyl-cyclopropylcarbonyloxy group, 2,3-dimethyl-cyclopropylcarbonyloxy group, 1-ethyl-cyclopropylcarbonyloxy group, 2-ethyl-cyclopropylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, cyclohexylcarbonyloxy group, 1-methyl-cyclopentylcarbonyloxy group, 2-methyl-cyclopentylcarbonyloxy group, 3-methyl-cyclopentylcarbonyloxy group, 1-ethyl-cyclobutylcarbonyloxy group, 2-ethyl-cyclobutylcarbonyloxy group, 3-ethyl-cyclobutylcarbonyloxy group, 1,2-dimethyl-cyclobutylcarbonyloxy group, 1,3-dimethyl-cyclobutylcarbonyloxy group, 2,2-dimethyl-cyclobutylcarbonyloxy group, 2,3-dimethyl-cyclobutylcarbonyloxy group, 2,4-dimethyl-cyclobutylcarbonyloxy group, 3,3-dimethyl-cyclobutylcarbonyloxy group, 1-n-propyl-cyclopropylcarbonyloxy group, 2-n-propyl-cyclopropylcarbonyloxy group, 1-i-propyl-cyclopropylcarbonyloxy group, 2-i-propyl-cyclopropylcarbonyloxy group, 1,2,2-trimethyl-cyclopropylcarbonyloxy group, 1,2,3-trimethyl-cyclopropylcarbonyloxy group, 2,2,3-trimethyl-cyclopropylcarbonyloxy group, 1-ethyl-2-methyl-cyclopropylcarbonyloxy group, 2-ethyl-1-methyl-cyclopropylcarbonyloxy group, 2-ethyl-2-methyl-cyclopropylcarbonyloxy group, and 2-ethyl-3-methyl-cyclopropylcarbonyloxy group.

Examples of the halogen group of $R^3$ include fluorine group, chlorine group, bromine group, and iodine group.

Examples of poly hafnium oxide used in the present invention include a hydrolysis-condensation product of hydrolyzable hafnium of Formula (2).

Examples of $R^4$ of Formula (2) are similar to those of $R^3$ of Formula (1),

Examples of zirconium oxide used in the present invention include hydrolysis-condensation products of hydrolyzable zirconium of Formula (3), Formula (4), or a combination of Formulae (3) and (4).

In Formulae (3) and (4), examples of each of $R^5$ and $R^6$ are similar to those of $R^3$ of Formula (1). A further example of each of $R^5$ and $R^6$ can be a nitrate ion.

Any methods, such as a method in which mixing a hydrolysis-condensation product with the (A) component, in which the hydrolysis-condensation product is obtained by hydrolyzing one or more compounds of each of Formulae (1), (2), (3), and (4), which are precursors of polysiloxan, poly hafnium oxide, or zirconium oxide; and a method in which the (A) component has been co-existed when hydrolyzing one or more compounds of each of Formulae (1), (2), (3), and (4); can be used in the present invention.

Examples of the hydrolysis-condensation product (a polymer or a copolymerized polymer) used in the present invention can be shown below as the (B) component alone, or as a combination of the (A) component and the (B) component,

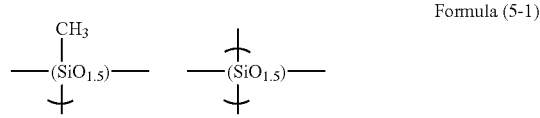

Formula (5-1)

Formula (5-2)

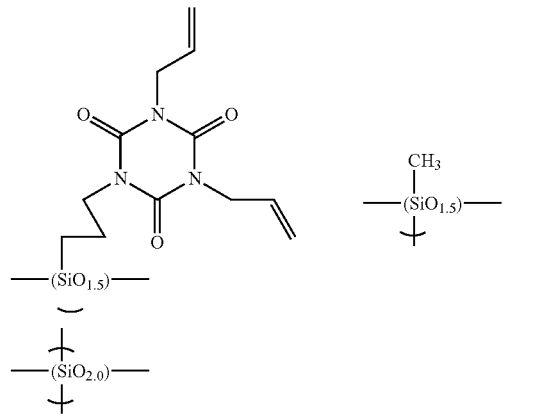

Formula (5-3)

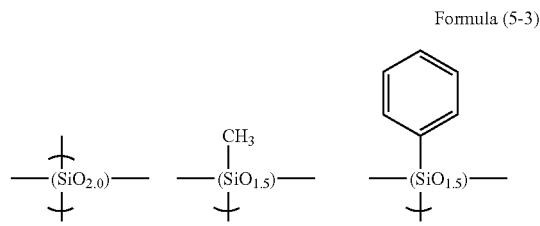

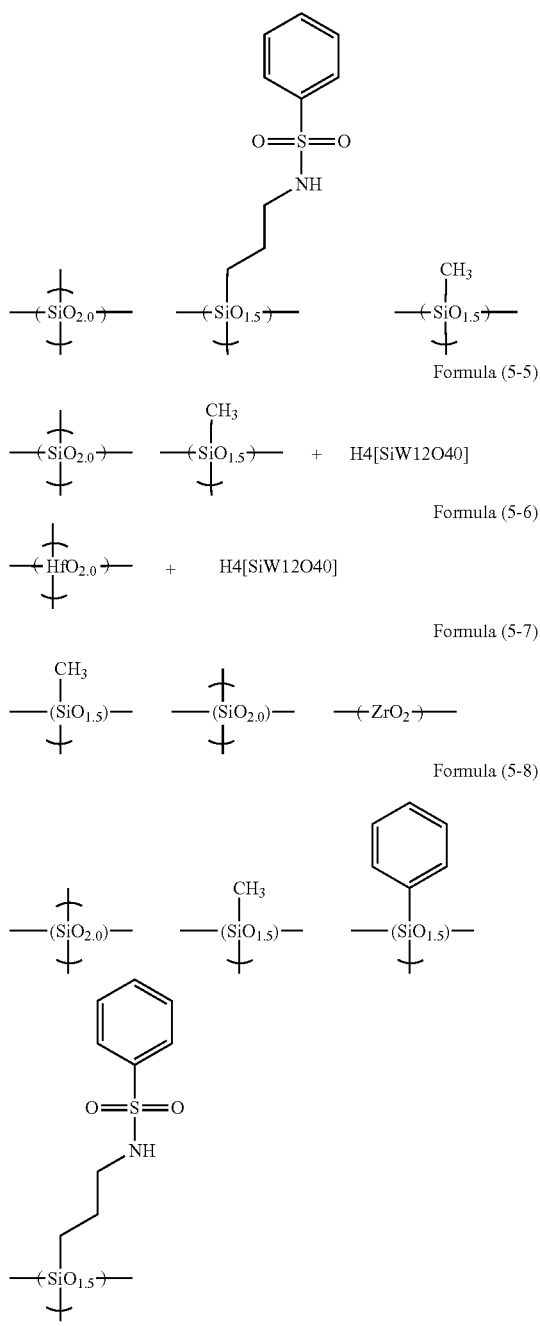

The hydrolysis-condensation product is a polymer or a copolymerized polymer, and can be obtained as a condensate having a weight-average molecular weight of 300 to 1,000,000, 300 to 100,000, or 300 to 20,000. These molecular weights can be obtained by a GPC analysis, in terms of polystyrene. Measuring conditions of GPC are, for example, GPC device: (trade name: HLC-8220GPC, manufactured by Tosoh Corporation), GPC column: (trade name: Shodex KF803L, KF802, and KF801, manufactured by Showa Denko K.K.), Column temperature: 40° C., Eluent (an elution solvent): tetrahydrofuran, Flow rate (flow velocity): 1.0 ml/min, and Standard sample: polystyrene (manufactured by Showa Denko K.K.).

To hydrolyze an alkoxysilyl group, an acyloxysilyl group, or a halogenated silyl group, 0.5 to 100 mol, preferably 1 to 10 mol of water is used for 1 mol of a hydrolyzable group.

In addition, 0.001 to 10 mol, preferably 0.001 to 1 mol of a hydrolysis catalyst can be used for 1 mol of the hydrolyzable group.

A reaction temperature for hydrolysis and condensation is usually 20 to 120° C.

Hydrolysis may be complete or partial. That is, a hydrolysate, a monomer, and the like may remain in a hydrolysis-condensation product. That is, the hydrolysis-condensation product may contain compounds of Formulae (1), (2), (3), and (4), or hydrolysates thereof.

A catalyst can be used when hydrolysis and condensation are conducted.

Examples of the hydrolysis catalyst include a metal chelate compound, an organic acid, an inorganic acid, an organic base, and an inorganic base.

Examples of the metal chelate compound as the hydrolysis catalyst include zirconium chelate compounds, such as triethoxy-mono(acetylacetonate)zirconium, tri-n-propoxy-mono(acetylacetonate)zirconium, tri-i-propoxy-mono (acetylacetonate)zirconium, tri-n-butoxy-mono(acetylacetonate)zirconium, tri-sec-butoxy-mono(acetylacetonate) zirconium, tri-t-butoxy-mono(acetylacetonate)zirconium, diethoxy-bis(acetylacetonate)zirconium, di-n-propoxy-bis (acetylacetonate)zirconium, di-i-propoxy-bis(acetylacetonate)zirconium, di-n-butoxy-bis(acetylacetonate)zirconium, di-sec-butoxy-bis(acetylacetonate)zirconium, di-t-butoxy-bis(acetylacetonate)zirconium, monoethoxy-tris(acetylacetonate)zirconium, mono-n-propoxy-tris(acetylacetonate) zirconium, mono-i-propoxy-tris(acetylacetonate)zirconium, mono-n-butoxy-tris(acetylacetonate)zirconium, mono-sec-butoxy-tris(acetylacetonate)zirconium, mono-t-butoxy-tris (acetylacetonate)zirconium, tetrakis(acetylacetonate)zirconium, triethoxy-mono(ethyl acetoacetate)zirconium, tri-n-propoxy-mono(ethyl acetoacetate)zirconium, tri-i-propoxy-mono(ethyl acetoacetate)zirconium, tri-n-butoxy-mono (ethyl acetoacetate)zirconium, tri-sec-butoxy-mono(ethyl acetoacetate)zirconium, tri-t-butoxy-mono(ethyl acetoacetate)zirconium, diethoxy-bis(ethyl acetoacetate)zirconium, di-n-propoxy-bis(ethyl acetoacetate)zirconium, di-i-propoxy-bis(ethyl acetoacetate)zirconium, di-n-butoxy-bis (ethyl acetoacetate)zirconium, di-sec-butoxy-bis(ethyl acetoacetate)zirconium, di-t-butoxy-bis(ethyl acetoacetate) zirconium, monoethoxy-tris(ethyl acetoacetate)zirconium, mono-n-propoxy-tris(ethyl acetoacetate)zirconium, mono-i-propoxy-tris(ethyl acetoacetate)zirconium, mono-n-butoxy-tris(ethyl acetoacetate)zirconium, mono-sec-butoxy-tris (ethyl acetoacetate)zirconium, mono-t-butoxy-tris(ethyl acetoacetate)zirconium, tetrakis (ethyl acetoacetate)zirconium, mono(acetylacetonate)tris(ethyl acetoacetate)zirconium, bis(acetylacetonate)bis(ethyl acetoacetate)zirconium, and tris(acetylacetonate)mono(ethyl acetoacetate)zirconium; and aluminum chelate compounds, such as tris(acetylacetonate)aluminum and tris(ethyl acetoacetate)aluminum.

Examples of the organic acid as the hydrolysis catalyst include acetic acid, propionic acid, butanoic acid, pentane acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, fluorinated acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononene, diazabicycloundecene, and tetramethylammonium hydroxide. Examples of the inorganic base as the hydrolysis catalyst include ammonia, sodium hydroxide, potassium hydroxide, barium hydroxide, and calcium hydroxide. Among these catalysts, a metal chelate compound, an organic acid, and an inorganic acid are preferable, and these may be used alone, or two or more of them may be used at the same time.

Examples of the organic solvent used for hydrolysis include aliphatic hydrocarbon solvents, such as n-pentane, i-pentane, n-hexane, i-hexane, n-heptane, i-heptane, 2,2,4-trimethylpentane, n-octane, i-octane, cyclohexane, and methyl cyclohexane; aromatic hydrocarbon solvents, such as benzene, toluene, xylene, ethyl benzene, trimethyl benzene, methylethyl benzene, n-propyl benzene, i-propyl benzene, diethyl benzene, i-butyl benzene, triethyl benzene, di-i-propyl benzene, n-amyl naphthalene, and trimethyl benzene; monoalcohol solvents, such as methanol, ethanol, n-propanol, i-propanol, n-butanol, i-butanol, sec-butanol, t-butanol, n-pentanol, i-pentanol, 2-methyl butanol, sec-pentanol, t-pentanol, 3-methoxy butanol, n-hexanol, 2-methyl pentanol, sec-hexanol, 2-ethyl butanol, sec-heptanol, heptanol-3, n-octanol, 2-ethyl hexanol, sec-octanol, n-nonyl alcohol, 2,6-dimethyl heptanal-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, cresol, and 4-methyl-2 pentanol; polyhydric alcohol solvents, such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethyl nonanone, cyclohexanone, methylcyclohexanone, 2,4-pentanedione, acetonyl acetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyl tetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxy butyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methyl formamide, N,N-dimethyl formamide, N,N-diethyl formamide, acetamide, N-methyl acetamide, N,N-dimethyl acetamide, N-methyl propionamide, and N-methyl pyrrolidone; and sulfur-containing solvents, such as dimethyl sulfide, diethyl sulfide, thiophene, tetrahydro thiophene, dimethyl sulfoxide, sulfolane, and 1,3-propane sultone. These solvents may be used alone, or two or more of them may be used in combination.

Among them, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferable.

Nonalcoholic polar solvents, including ketones such as acetone, and tetrahydrofuran can also be preferred, when hydrolyzable silane (silane having two to three hydrolysis groups in the silane molecule during hydrolysis) is used as a raw material. However, if silane has five to nine hydrolysis groups in a hydrolyzable silane molecule, hydrolysis and condensation proceed too much in such an acetone solvent, and gelation occurs easily.

A hydrolysis-condensation product (polymer, copolymerized polymer) can be obtained by hydrolyzing and condensing a hydrolyzable organo silane or the like of the (B) component in a solvent with or without a catalyst. An alcohol that is a byproduct, a hydrolysis catalyst used, water, and the like can be removed at the same time by vacuum distillation or the like from the hydrolysis-condensation product. An acid catalyst or a base catalyst used for hydrolysis can be removed by neutralization, ion exchange, and the like. For stabilization, an acid (an organic acid), salt, water, an alcohol, or a combination thereof can be added to the resist underlayer film-forming composition used for the lithography process of the present invention, which contains the hydrolysis-condensation product of the composition.

Examples of the organic acid include oxalic acid, malonic acid, methyl malonic acid, succinic acid, maleic acid, malic acid, tartaric acid, phthalic acid, citric acid, glutaric acid, citric acid, lactic acid, and salicylic acid. In particular, oxalic acid, maleic acid, acetic acid, propionic acid, butyric acid, valeric acid, hexanoic acid, heptanoic acid, octanoic acid, acrylic acid, methacrylic acid, crotonic acid, vinyl acetic acid, hexenoic acid, fumaric acid, phenylacetic acid, phenylpropionic acid, triphenylacetic acid, cinnamic acid, benzoic acid, trimellitic acid, and pyromellitic acid are preferable. The amount of an organic acid to be added is 0.5 to 5.0 parts by mass to 100 parts by mass of the (B) component. As water to be added, pure water, ultrapure water, ion exchanged water, or the like can be used, and an addition amount thereof can be 1 to 20 parts by mass to 100 parts by mass of the resist underlayer film-forming composition.

A salt can be contained in the resist underlayer film-forming composition of the present invention. The salt functions as a curing catalyst when a coating film containing a condensate (polyorganosiloxane, a copolymerized polymer, or a combination thereof) is heated and cured.

As the salt, an ammonium salt, a phosphine, a phosphonium salt, and a sulfonium salt can be used. The amount of the salt to be added is 0.01 to 10 parts by mass, or 0.01 to 5 parts by mass, or 0.01 to 3 parts by mass, to 100 parts by mass of the (B) component.

If desired, a resist underlayer film-forming composition for lithography of the present invention can further contain an organic polymer compound, a photo acid generator, a surfactant, and the like, in addition to the components described above.

By using an organic polymer compound, a dry etching rate (a decreasing amount of the film thickness per unit of time), an attenuation coefficient, and a refractive index of a resist underlayer film to be formed of a resist underlayer film-forming composition for lithography of the present invention can be adjusted.

The organic polymer compound is not particularly limited, and a variety of organic polymers can be used. For example, condensation polymerization polymer and an addition polymerization polymer can be used as the organic polymer compound. Examples of the addition polymerization polymer and the condensation polymerization polymer include polyesters, polystyrenes, polyimides, acrylic polymers, methacrylic polymers, polyvinyl ethers, phenol novolac, naphthol novolac, polyethers, polyamides, and polycarbonates. Also, an organic polymer having an aromatic ring structure that functions as an absorptive portion, such as a benzene ring, a naphthalene ring, an anthracene ring, a triazine ring, a quinoline ring, and a quinoxaline ring, is preferably used. Examples of the organic polymer compound include an addition polymerization polymer having an addition polymerization monomer, such as benzyl acrylate, benzyl methacrylate, phenyl acrylate, naphthyl acrylate, anthryl methacrylate, anthrylmethyl methacrylate, styrene, hydroxy styrene, benzylvinyl ether, and N-phenyl maleimide, as a structural unit thereof; and a condensation polymerization polymer such as phenol novolac and naphthol novolac.

In the case where an addition polymerization polymer is used as the organic polymer compound, the polymer may be a homopolymer or a copolymer. Addition polymerization monomers are used for manufacturing an addition polymerization polymer. Examples of the addition polymerization monomer include acrylic acid, methacrylic acid, an acrylic acid ester compound, a methacrylic acid ester compound, an acrylamide compound, a methacrylamide compound, a vinyl compound, a styrene compound, a maleimide compound, maleic acid anhydride, and acrylonitrile.

In the case where the organic polymer compound contains a hydroxy group, the hydroxy group can be cross-linked with polyorganosiloxane or the like in the (B) component.

A polymer compound having weight-average molecular weight of, for example, 1,000 to 1,000,000, or 3,000 to 300,000, or 5,000 to 200,000, or 10,000 to 100,000, can be used as the organic polymer compound.

In the case where the organic polymer compound is used, the ratio thereof is 1 to 200 parts by mass, or 5 to 100 parts by mass, or 10 to 50 parts by mass, or 20 to 30 parts by mass, to 100 parts by mass of the (B) component.

A resist underlayer film-forming composition of the present invention can contain an acid generator. Examples of the acid generator include thermal acid generators and photo acid generators.

A photo acid generator generates acid when a resist is exposed to light, and thus the acidity of an underlayer film can be controlled. This is one of methods to adjust the acidity of an underlayer film to that of a resist of the top layer. Also, by controlling the acidity of an underlayer film, the pattern shape of a resist formed on the top layer can be controlled.

Examples of the photo acid generator contained in a resist underlayer film-forming composition of the present invention include onium salt compounds, sulfonimide compounds, and disulfonyldiazomethane compounds.

Examples of the onium salt compound include iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butanesulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

Photo acid generators may be used alone, or two or more of them may be used in combination.

In the case where a photo acid generator is used, the ratio thereof is 0.01 to 5 parts by mass, or 0.1 to 3 parts by mass, or 0.5 to 1 part by mass, to 100 parts by mass of the (B) component.

Use of a surfactant is effective to suppress generation of any pinholes, striation, and the like, when coating a substrate with a resist underlayer film-forming composition for lithography of the present invention.

To a resist underlayer film-forming composition of the present invention, a rheology modifier, an adhesion auxiliary agent, and the like can be added. The rheology modifier is useful to improve fluidity of a resist underlayer film-forming composition. The adhesion auxiliary agent is useful to improve adhesion between a semiconductor substrate or a resist and a thin film.

A solvent used for a resist underlayer film-forming composition of the present invention is not particularly limited, provided that the solid content explained above can be dissolved in the solvent. Examples of the solvent include methanol, ethanol, propanol, isopropanol, butanol, 4-methyl-2-pentanol, methyl cellosolve acetate, ethyl cellosolve acetate, propylene glycol, propylene glycol monomethyl ether, propylene glycol monoethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methyl propionate, ethoxy ethyl acetate, hydroxy ethyl acetate, methyl 2-hydroxy-3-methyl butanoate, methyl 3-methoxy propionate, ethyl 3-methoxy propionate, ethyl 3-ethoxy propionate, methyl 3-ethoxy propionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, n-butyl acetate, i-butyl acetate, sec-butyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, hydroxy ethyl acetate, ethyl 2-hydroxy-2-methyl propionate, methyl 3-methoxy-2-methyl propionate, methyl 2-hydroxy-3-methyl butyrate, methoxyacetic acid ethyl ester, ethoxyacetic acid ethyl ester, 3-methoxypropionic acid methyl ester, 3-ethoxypropionic acid ethyl ester, 3-methoxypropionic acid ethyl ester, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, acetoacetic acid methyl ester, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methyl pyrrolidone, methyl isobutyl carbinol, and γ-butyrolactone. These solvents can be used alone, or two or more of them can be used in combination.

Hereinafter, a use of the resist underlayer film-forming composition of the present invention will be explained.

A substrate for use in the manufacturing of a semiconductor device (for example, a silicon wafer substrate, a silicon/silicon dioxide coated substrate, a silicon nitride substrate, a glass substrate, an ITO substrate, a polyimide substrate, and a low dielectric constant material (low-k material) coated substrate) is coated with a resist underlayer film-forming composition of the present invention using a suitable coating instrument such as a spinner and a coater, and then the composition is baked to form a resist underlayer film. As a baking condition, each of a baking temperature and a baking time is suitably selected from a range of 80 to 500° C. or 80 to 250° C., and a range of 0.3 to 60 minutes, respectively. Preferably, a baking temperature is 150 to 500° C., and a baking time is 0.5 to 2 minutes. A film thickness of the underlayer film to be formed is, for example, 10 to 1,000 nm, preferably 20 to 500 nm, more preferably 50 to 300 nm, still more preferably 100 to 200 nm, and most preferably 10 to 100 nm.

Then, for example, a photoresist layer is formed on the formed resist underlayer film. The photoresist layer can be formed by a well known method, in which, the underlayer film is coated with a photoresist composition solution, and the underlayer film coated with the composition is baked. Film thickness of the photoresist is, for example, 50 to 10,000 nm, preferably 100 to 2,000 nm, more preferably 200 to 1,000 nm, and still more preferably 30 to 200 nm.

In the present invention, an organic underlayer film may be formed on a substrate, then a resist underlayer film of the present invention is formed on the organic underlayer film or the substrate, and finally the resist underlayer film can be coated with a photoresist. According to this step, a width of the photoresist pattern becomes narrow, and the substrate can be processed by selecting a suitable etching gas, even if the photoresist is applied as a thin layer in order to prevent collapse of the resist pattern. For example, a resist underlayer film of the present invention can be processed by using a fluorine-containing gas that has an etching rate sufficiently higher than that of a photoresist as an etching gas; an organic underlayer film can be processed by using an oxygen-containing gas that has an etching rate sufficiently higher than that of the resist underlayer film of the present invention as an etching gas; and a substrate can be processed by using a fluorine-containing gas that has an etching rate sufficiently higher than that of the organic underlayer film as an etching gas.

A photoresist to be formed on a resist underlayer film of the present invention is not particularly limited, provided that the photoresist is photosensitive to light used for exposure. Any of a negative-type photoresist and a positive-type photoresist can be used. Examples of the photoresist include a positive-type photoresist containing a novolac resin and 1,2-naphthoquinone diazide sulfonic acid ester; a chemically amplified photoresist containing a binder having a group to be decomposed with acid to increase an alkali dissolution rate, and containing a photo acid generator; a chemically amplified photoresist containing a low molecular weight compound decomposed with acid to increase an alkali dissolution rate of photoresist, an alkali-soluble binder, and a photo acid generator; and a chemically amplified photoresist containing a binder having a group to be decomposed with acid to increase an alkali dissolution rate, a low molecular weight compound to be decomposed with acid to increase an alkali dissolution rate of photoresist, and a photo acid generator. Specific examples thereof include trade name: APEX-E, manufactured by Shipley Co., Ltd.; trade name: PAR 710, manufactured by Sumitomo Chemical Co., Ltd.; and trade name: SEPR 430, manufactured by Shin-Etsu Chemical Co., Ltd. In addition, the examples include a fluorine-atom containing polymer photoresist described in Proc. SPIE, Vol. 3999, 330-334 (2000), Proc. SPIE, Vol. 3999, 357-364 (2000), and Proc. SPIE, Vol. 3999, 365-374 (2000).

Then, exposure is conducted through the given mask. For exposure, a KrF excimer laser (a wavelength of 248 nm), an ArF excimer laser (a wavelength of 193 nm), F2 excimer laser (a wavelength of 157 nm), or the like can be used. If necessary, post exposure bake can be conducted. Each of a baking temperature and a baking time for conducting the post exposure bake is suitably selected from a range of 70 to 150° C. and a range of 0.3 to 10 minutes, respectively.

In the present invention, a resist for electron beam lithography or an EUV resist can be used as a resist instead of a photoresist. Any of a negative-type and a positive-type may be used for the electron beam resist. Examples include: a chemically amplified resist including an acid generator and a binder having a group that is decomposed with an acid to change the alkali dissolution rate; a chemically amplified resist including an alkali soluble binder, an acid generator, and a low molecular weight compound that is decomposed with an acid to change the alkali dissolution rate of the resist; a chemically amplified resist including an acid generator, a binder having a, group that is decomposed with an acid to change the alkali dissolution rate, and a low molecular weight compound that is decomposed with an acid to change the alkali dissolution rate of the resist; a non-chemically amplified resist including a binder having a group that is decomposed with an electron beam to change the alkali dissolution rate; and a non-chemically amplified resist including a binder having a moiety that is cleaved by an electron beam to change the alkali dissolution rate. In the case where these electron beam resists are used, resist patterns can be formed in the same manner as in the case where photoresists are used with an electron beam as a radiation source.

Also, methacrylate resin resists can be used as EUV resists.

Next, development is conducted with a developing solution. Accordingly, for example, when a positive-type photoresist is used, a photoresist in an exposed portion is removed to form a photoresist pattern.

Examples of the developing solution include alkaline aqueous solutions, such as an aqueous solution of an alkali metal hydroxide, such as potassium hydroxide and sodium hydroxide; an aqueous solution of quaternary ammonium hydroxide, such as tetramethylammonium hydroxide, tetraethylammonium hydroxide, and choline; and an aqueous solution of amine, such as ethanolamine, propylamine, and ethylenediamine. A surfactant and the like can further be added to the developing solution. Conditions of development are suitably selected from temperatures within a range from 5 to 50° C., and times within a range from 10 to 600 seconds.

By using a photoresist (top layer) pattern formed as such, as a protection film, a resist underlayer film of the present invention (middle layer) is removed, and then, by using a film containing a patterned photoresist and a patterned resist underlayer film of the present invention (middle layer) as protection films, an organic underlayer film (underlayer) is removed. Finally, by using the patterned resist underlayer film of the present invention (middle layer) and a patterned organic underlayer film (underlayer) as protection films, a semiconductor substrate is processed.

In the method described above, firstly, the resist underlayer film of the present invention (middle layer) in which a photoresist has been removed is removed by dry etching to expose a semiconductor substrate. For dry etching of the resist underlayer film of the present invention, a gas, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane, and dichloroborane can be used. In particular, a halogen-containing gas is preferably used for dry etching of the resist underlayer film of the present invention. Basically, photoresists composed of organic materials are hard to be removed by dry etching using halogen-containing gasses. On the contrary, the resist underlayer film of the present invention containing many silicon atoms is immediately removed by a halogen-containing gas. Accordingly, the reduction in film thickness of a photoresist caused by dry etching of the resist underlayer film can be suppressed. As a result, the photoresist can be used as a thin film. Dry etching of the resist underlayer film can also be conducted with a fluorine-containing gas. Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

Dry etching of a resist underlayer film of the present invention is preferably conducted with a halogen-containing gas. Examples of the halogen-containing gas include hydrogen bromide (HBr) and chlorine (Cl), and by mixing the halogen-containing gas with a fluorine-containing gas such as $CF_4$ and $CHF_3$, or with an oxygen-containing gas such as $O_2$, the selection rate in the etching to that of a resist can be obtained.

After that, by using a film containing a patterned photoresist and a patterned resist underlayer film of the present invention as protection films, an organic underlayer film is removed. Dry etching is preferably conducted to the organic underlayer film (underlayer) and the organic anti-reflective coating by using an oxygen-containing gas, because by using an oxygen-containing gas, a resist underlayer film of the present invention containing many silicon atoms is hard to be removed by dry etching.

Finally, a semiconductor substrate is processed. The semiconductor substrate is preferably processed by dry etching using a fluorine-containing gas.

Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

An organic anti-reflective coating can be formed on the top layer of a resist underlayer film of the present invention prior to forming a photoresist. An anti-reflective coating composition is not particularly limited, and can be suitably selected from compositions that have been conventionally used in lithography processes, and the anti-reflective coating can be formed by a conventional method, such as a method including coating with a spinner or a coater, and baking.

Such a multilayer process includes the steps of: forming an organic underlayer film on a semiconductor substrate; forming a resist underlayer film (thin film) by applying a resist underlayer film (the thin film)-forming composition of the present invention onto the organic underlayer film, and then baking the applied resist underlayer film-forming composition; forming an organic resist underlayer film by applying an organic resist underlayer film-forming composition onto the resist underlayer film; forming a resist layer by applying a composition for resists onto the organic resist underlayer film; exposing the resist film; obtaining a resist pattern by developing the exposed resist film; etching the organic resist underlayer film with the resist pattern; etching the resist underlayer film (the thin film) of the present invention with a patterned organic resist underlayer film; etching the organic underlayer film with a patterned resist underlayer film; and processing the semiconductor substrate with a patterned organic underlayer film to manufacture semiconductor devices.

A surface of a substrate to be coated with a resist underlayer film-forming composition of the present invention may have an organic or inorganic anti-reflective coating that is formed by a CVD method or the like, and an underlayer film of the present invention may be formed on the anti-reflective coating.

A resist underlayer film to be formed of the resist underlayer film-forming composition of the present invention may absorb light used in a lithography process, depending on a wavelength of the light. In such a case, the resist underlayer film-forming composition of the present invention can serve as an anti-reflective coating that prevents reflected light from a substrate. Further, the underlayer film of the present invention can be used as a layer preventing interaction between a substrate and a photoresist; layer preventing adverse effects on a substrate due to materials used for a photoresist or substances generated at the time of light exposure to the photoresist; a layer preventing diffusion of substances generated on the substrate at the time of heating and baking to the top layer photoresist; a barrier layer for reducing poisoning effects of a photoresist layer resulting from a semiconductor substrate dielectric layer; and the like.

A resist underlayer film to be formed of the resist underlayer film-forming composition of the present invention can also be applied to a substrate on which via holes that are used in a dual damascene process are formed, and the resist underlayer film can be used as an embedded material to fill the holes without any gaps. In addition, the resist underlayer film can be used as a planarization material for planarizing uneven surfaces of semiconductor substrates.

Hereinafter, cases where the thin film-forming composition of the present invention is used as an EUV resist underlayer film-forming composition will be explained.

In the present invention, any of a negative-type and a positive-type may be used as an EUV resist to applied on the top layer of an EUV resist underlayer film. Examples include: a chemically amplified resist including an acid generator and a binder having a group to be decomposed with an acid to change the alkali dissolution rate; a chemically amplified resist including an alkali soluble binder, an acid generator, and a low molecular weight compound to be decomposed with an acid to change the alkali dissolution rate of the resist; a chemically amplified resist including an acid generator, a binder having a group to be decomposed with an acid to change the alkali dissolution rate, and a low molecular weight compound to be decomposed with an acid to change the alkali dissolution rate of the resist; a non-chemically amplified resist including a binder having a group to be decomposed with EUV to change the alkali dissolution rate; and a non-chemically amplified resist including a binder having a moiety that is cleaved by EUV to change the alkali dissolution rate.

As the development liquid for the positive-type resist having the resist underlayer film formed by using the EUV resist underlayer film-forming composition of the present invention, the following aqueous alkali solutions can be used. The aqueous alkali solutions includes solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salt such as tetramethylammonium hydroxide, tetraethylammonium hydroxide, and choline; and cyclic amines such as pyrrole and piperidine. To the aqueous solutions of the alkalis described above, an adequate amount of alcohols such as isopropyl alcohol or a surfactant such as a nonionic surfactant can be added and the mixture can be used. Among these development liquids, aqueous solutions of the quaternary ammonium salts are preferable and aqueous solutions of tetramethylammonium hydroxide and choline are further preferable.

The present invention includes the steps of: forming an EUV resist underlayer film of the present invention on a substrate having a processing target film onto which a transfer pattern is to be formed; forming an EUV resist film on the EUV resist underlayer film; exposing the semiconductor substrate coated with the EUV resist film; and performing development after exposure to remove the resist film and the resist underlayer film, so that a semiconductor device can be manufactured.

The exposure is performed with EUV (at a wavelength of 13.5 nm).

Further, the resist underlayer film-forming composition of the present invention can be used as the underlayer film of an EUV resist, and as the underlayer anti-reflective coating of an EUV resist, which prevents reflection of exposure light undesirable at the time of EUV exposure, such as UV and DUV described above, from a substrate or an interface without intermixing with the EUV resist. The formed resist underlayer film of the present invention can efficiently prevent reflection at the underlayer of an EUV resist. When the resist underlayer film is used as an EUV resist underlayer film, a process can be conducted in the same manner as in the case of the underlayer film for photoresists.

Next, a method for using a resist underlayer film-forming composition of the present invention as the underlayer film of a resist that is used for solvent development will be explained.

The substrate is coated with a resist underlayer film-forming composition of the present invention by a suitable coating method using a spinner, a coater, or the like, and then the composition is baked to form a resist underlayer film. Alternatively, before the substrate is coated with a resist underlayer film used in the present invention, an organic underlayer film is formed on the substrate, and the thin film can be formed on the organic underlayer film.

A photoresist formed on a thin film (resist underlayer film) of the present invention is not particularly limited, provided that the photoresist is photosensitive to light used for exposure, such as ArF light. Any of a negative-type photoresist and a positive-type photoresist can be used. Photoresists that can be developed with an organic solvent after exposure can be used.

The baking condition described above can be applied.

Then, for example, the photoresist layer described above is formed on the resist underlayer film of the present invention.

Also, in this case, according to the present invention, a resist for EUV lithography or a resist for electron beam lithography can be used as a resist instead of a photoresist. For the resist for EUV lithography and the electron beam resist, any of a negative-type and a positive-type may be used. As the exposure condition, the condition described above can be used. Resists that can be developed with organic solvents after exposure can be used.

Next, development is conducted with a developing solution (organic solvent). Accordingly, for example, when a positive-type photoresist is used, a photoresist at an unexposed portion is removed to form a photoresist pattern.

Examples of the developing solution include methyl acetate, butyl acetate, ethyl acetate, isopropyl acetate, amyl acetate, isoamyl acetate, ethyl methoxyacetate, ethyl ethoxyacetate, 2-heptanone, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxy butyl acetate, 4-methoxy butyl acetate, 3-methyl- 3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxypropionic acid methyl ester, 2-hydroxypropionic acid ethyl ester, methyl-3-methoxy propionate, ethyl-3-methoxy propionate, ethyl-3-ethoxy propionate, and propyl-3-methoxy propionate. Butyl acetate, 2-heptanone, and the like can preferably be used as the developing solution described above.

A surfactant and the like can further be added to the developing solution. A condition of development is suitably selected from temperatures within a range from 5 to 50° C., and times within a range from 10 to 600 seconds.

By using a photoresist (top layer) pattern formed as such, as protection films, a resist underlayer film of the present invention (middle layer) is removed, and then, by using a film composed of a patterned photoresist and a patterned resist underlayer film of the present invention (middle layer) as protection films, an organic underlayer film (underlayer) is removed, Finally, by using the patterned resist underlayer film of the present invention (middle layer) and a patterned organic underlayer film (underlayer) as protection films, a semiconductor substrate is processed.

Firstly, the resist underlayer film of the present invention (middle layer) in which a photoresist has been removed is removed by dry etching to expose a semiconductor substrate. For dry etching of a thin film of the present invention, a gas, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane, and dichloroborane can be used. In particular, a halogen-containing gas is preferably used for dry etching of the thin film of the present invention. Basically, photoresists composed of organic materials are hard to be removed by dry etching using halogen-containing gasses. On the contrary, a resist underlayer film of the present invention containing many silicon atoms is immediately removed by a halogen-containing gas. Accordingly, the reduction in film thickness of a photoresist caused by dry etching of the resist underlayer film of the present invention can be suppressed. As a result, the photoresist can be used as a thin film.

Dry etching of the thin film of the present invention is conducted preferably with a fluorine-containing gas. Examples of the fluorine-containing gas include tetrafluoromethane ($CF_4$), perfluorocyclobutane ($C_4F_8$), perfluoropropane ($C_3F_5$), trifluoromethane, and difluoromethane ($CH_2F_2$).

After that, by using a film composed of a patterned photoresist and a patterned resist underlayer film of the present invention as protection films, an organic underlayer film is removed. Dry etching is preferably conducted to the organic underlayer film (underlayer) by using an oxygen-containing gas, because a thin film of the present invention containing many silicon atoms is hard to be removed by dry etching using an oxygen-containing gas.

Finally, a semiconductor substrate is processed. The semiconductor substrate is preferably processed by dry etching using a fluorine-containing gas.

Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

A thin film according to a resist underlayer film-forming composition of the present invention can be used as a reverse material by selecting a solvent that does not dissolve a resist. To use the thin film as a reverse material, firstly, a resist pattern formed on a substrate is coated with a resist underlayer film-forming composition of the present invention, and the composition is dried to form a thin film. Then, the formed thin film is etched back to expose the surface of the resist pattern, and dry etching is conducted with a gas that selectively removes the resist (for example, an oxygen-containing gas) such that only the thin film remains. As a result, the pattern will be reversed.

EXAMPLES (Preparation of Metatungstic Acid Aqueous Solution)

20.0 g of ammonium metatungstate (manufactured by Nippon Inorganic Colour & Chemical Co., Ltd., 90.8% by mass in terms of $WO_3$) was dissolved in 80.1 g of ion exchange water to prepare an ammonium metatungstate aqueous solution. After 20.0 g of a cation exchange resin (manufactured by Organo Corporation, Amberlist 15JWET) was added thereto, the mixture was stirred at a room temperature for 4 hours, and then filtrated to obtain a metatungstic acid aqueous solution. The pH of the obtained solution was 0.54. The solid residue at 140° C. was 17.0%.

Synthesis Example 1

18.94 g (30 mol %) of methyltriethoxysilane, 51.62 g (70 mol %) of tetraethoxysilane, and 105.84 g of acetone were placed in a 300 ml flask, and 23.60 g of 0.01 mol/l hydrochloric acid was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and 142.00 g of propylene glycol monomethyl ether was added to the reaction solution to distill off reaction by-products, including ethanol, water, hydrochloric acid, and acetone, under reduced pressure. After condensation, a propylene glycol monomethyl ether solution of a hydrolysis-condensation product (polymer) was obtained. The solution was diluted with propylene glycol monomethyl ether, so that the solid residue at 140° C. was 30.0% by weight. The obtained polymer was represented by Formula (5-1).

Synthesis Example 2

18.99 g (15 mol %) of 3-(triethoxysilylpropyl)diallyl isocyanurate, 44.65 g (70 mol %) of tetraethoxysilane, 8.19 g (15 mol %) of methyltriethoxysilane, and 71.83 g of acetone were placed in a 300 ml flask, and 20.41 g of 0.01 mol/l hydrochloric acid was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and 142.00 g of propylene glycol monomethyl ether was added to the reaction solution to distill off reaction by-products, including ethanol, water, hydrochloric acid, and acetone, under reduced pressure. After concentration, a propylene glycol monomethyl ether solution of a hydrolysis-condensation product (polymer) was obtained. The solution was diluted with propylene glycol monomethyl ether, so that the solid residue at 140° C. was 30.0% by weight. The obtained polymer was represented by Formula (5-2).

Synthesis Example 3

9.63 g (14 mol %) of phenyltrimethoxysilane, 9.28 g (15 mol %) of methyltriethoxysilane, 50.59 g (70 mol %) of tetraethoxysilane, 1.25 g (1 mol %) of N-(3-(triethoxysilyl)propyl)benzenesulfonamide, and 106.12 g of acetone were placed in a 300 ml flask, and 23.13 g of 0.01 mol/l hydrochloric acid was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and 142.00 g of propylene glycol monomethyl ether was added to the reaction solution to distill off reaction by-products, including methanol, ethanol, water, hydrochloric acid, and acetone, under reduced pressure. After concentration, a propylene glycol monomethyl ether solution of a hydrolysis-condensation product (polymer) was obtained. The solution was diluted with propylene glycol monomethyl ether, so that the solid residue at 140° C. was 30.0% by weight. The obtained polymer was represented by Formula (5-8).

Synthesis Example 4

4.48 g of methyltriethoxysilane, 15.73 g of tetraethoxysilane, and 76.31 g of methanol were placed in a 300 ml flask, and a solution in which 17.94 g of zirconyl nitrate dihydrate $(ZrO(NO_3)_2\cdot 2H_2O)$ was dissolved in 76.31 g of methanol and 9.22 g of ultrapure water was added dropwise to the mixed solution with stirring by a magnetic stirrer. After that, the flask was placed in an oil bath whose temperature was adjusted to 85° C., and the solution was warmed to reflux for 120 minutes to be reacted. Then, the reaction solution was cooled to a room temperature, and 200 g of propylene glycol monomethyl ether was added to the reaction solution to distill off reaction by-products, including methanol, ethanol, and water, under reduced pressure, and finally the solid residue at 140° C. was adjusted to 15.0% by weight. The obtained polymer was represented by Formula (5-7).

(Preparation of Resist Underlayer Film)

Ammonium metatungstate or metatungstic acid, and the silicon-containing polymer obtained in the synthesis example described above, an acid, a curing catalyst, an additive, a solvent, and water were mixed according to the mixing ratio shown in Table 1, and then the mixture was filtrated through a fluororesin filter having a pore size of 0.1 µm to prepare each of the resist underlayer film-forming composition solutions. The addition ratios of the polymers shown in Table 1 represent addition amounts of polymers themselves, and do not represent addition amounts of polymer solutions.

The abbreviations in Table 1 are explained below: MA is maleic acid, $MeSO_3$ is methanesulfonic acid, $HNO_3$ is nitric acid, BTEAC is benzyltriethylammonium chloride, TPS105 is triphenylsulfonium trifluoromethane sulfonate, TPSMA is monotriphenylsulfonium maleate, and PGME is propylene glycol monomethyl ether. The water used was ultrapure water. Each of the addition amounts are represented by parts by mass.

TABLE 1

| | Tungsten Component | Polymer | Acid | Curing Catalyst | Additive | Solvent | |
|---|---|---|---|---|---|---|---|
| Example 1 (Parts by Mass) | Metatungstic Acid 1.0 | Synthesis Example 1 1.0 | MA 0.02 | BTEAC 0.006 | | PGME 90 | Water 10 |
| Example 2 (Parts by Mass) | Metatungstic Acid 0.6 | Synthesis Example 1 1.4 | MA 0.02 | BTEAC 0.006 | | PGME 90 | Water 10 |
| Example 3 (Parts by Mass) | Ammonium Metatungstate 1.4 | Synthesis Example 1 0.6 | MA 0.02 | BTEAC 0.006 | | PGME 90 | Water 10 |
| Example 4 (Parts by Mass) | Ammonium Metatungstate 1.0 | Synthesis Example 1 1.0 | MA 0.02 | BTEAC 0.006 | | PGME 90 | Water 10 |
| Example 5 (Parts by Mass) | Ammonium Metatungstate 0.6 | Synthesis Example 1 1.4 | MA 0.02 | BTEAC 0.006 | | PGME 90 | Water 10 |
| Example 6 (Parts by Mass) | Metatungstic Acid 1.0 | Synthesis Example 2 1.0 | MA 0.02 | BTEAC 0.006 | | PGME 90 | Water 10 |
| Example 7 (Parts by Mass) | Metatungstic Acid 0.6 | Synthesis Example 2 1.4 | MA 0.02 | BTEAC 0.006 | | PGME 90 | Water 10 |
| Example 8 (Parts by Mass) | Metatungstic Acid 0.6 | Synthesis Example 3 1.4 | MeS03 0.06 | BTEAC 0.006 | | PGME 90 | Water 10 |
| Example 9 (Parts by Mass) | Metatungstic Acid 0.6 | Synthesis Example 2 1.4 | MeS03 0.06 | TPSMA 0.006 | | PGME 90 | Water 10 |
| Example 10 (Parts by Mass) | Metatungstic Acid 0.6 | Synthesis Example 2 1.4 | MeS03 0.06 | TPSMA 0.006 | TPS105 0.02 | PGME 90 | Water 10 |

TABLE 1-continued

| | Tungsten Component | Polymer | Acid | Curing Catalyst | Additive | Solvent | |
|---|---|---|---|---|---|---|---|
| Example 11 (Parts by Mass) | Metatungstic Acid 0.6 | Synthesis Example 4 1.4 | HN03 2.4 | | | PGME 90 | Water 10 |
| Comparative Example 1 (Parts by Mass) | Ammonium Metatungstate 2.0 | | MA 0.02 | | | PGME 90 | Water 10 |
| Comparative Example 2 (Parts by Mass) | Metatungstic Acid 2.0 | | MA 0.02 | | | PGME 90 | Water 10 |

Synthesis Example 5

25.81 g (70 mol %) of tetraethoxysilane, 9.47 g (30 mol %) of methyltriethoxysilane, and 52.92 g of acetone were placed in a 300 ml flask, and 11.80 g of 0.01 mol/l hydrochloric acid was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and 68.00 g of propylene glycol monomethyl ether acetate was added to the reaction solution to distill off reaction by-products, including methanol, ethanol, acetone, water, and hydrochloric acid, under reduced pressure. After concentration, a propylene glycol monomethyl ether acetate solution of a hydrolysis-condensation product (polymer) was obtained. Propylene glycol monoethyl ether was added to the solution, so that the solvent ratio of propylene glycol monomethyl ether acetate/propylene glycol monoethyl ether was adjusted to 20/80, and the solid residue at 140° C. was adjusted to 20% by weight. The obtained polymer is represented by Formula (5-1), and the weight-average molecular weight determined by GPC was Mw 2,000 in terms of polystyrene.

Synthesis Example 6

25.59 g (70 mol %) of tetraethoxysilane, 6.26 g (20 mol %) of methyltriethoxysilane, 3.48 g (10 mol %) of phenyltrimethoxysilane, and 52.98 g of acetone were placed in a 300 ml flask, and 11.69 g of 0.01 mol/l hydrochloric acid was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and 68.00 g of propylene glycol monomethyl ether acetate was added to the reaction solution to distill off reaction by-products, including methanol, ethanol, acetone, water, and hydrochloric acid, under reduced pressure. After concentration, a propylene glycol monomethyl ether acetate solution of a hydrolysis-condensation product (polymer) was obtained. Propylene glycol monoethyl ether was added to the solution, so that the solvent ratio of propylene glycol monomethyl ether acetate/propylene glycol monoethyl ether was adjusted to 20/80, and the solid residue at 140° C. was adjusted to 20% by weight. The obtained polymer is represented by Formula (5-3), and the weight-average molecular weight determined by GPC was Mw 2,000 in terms of polystyrene.

Synthesis Example 7

22.32 g (70 mol %) of tetraethoxysilane, 4.09 g (15 mol %) of methyltriethoxysilane, 9.49 g (1.5 mol %) of 3-(triethoxysilyl)propyl diallyl isocyanurate, and 53.88 g of acetone were placed in a 300 ml flask, and 10.20 g of 0.01 mol/l hydrochloric acid was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and 68.00 g of propylene glycol monomethyl ether acetate was added to the reaction solution to distill off reaction by-products, including methanol, ethanol, acetone, water, and hydrochloric acid, under reduced pressure. After concentration, a propylene glycol monomethyl ether acetate solution of a hydrolysis-condensation product (polymer) was obtained. Propylene glycol monoethyl ether was added to the solution, so that the solvent ratio of propylene glycol monomethyl ether acetate/propylene glycol monoethyl ether was adjusted to 20/80, and the solid residue at 140° C. was adjusted to 20% by weight. The obtained polymer is represented by Formula (5-2), and the weight-average molecular weight determined by GPC was Mw 2,000 in terms of polystyrene.

Synthesis Example 8

24.81 g (70 mol %) of tetraethoxysilane, 7.58 g (25 mol %) of methyltriethoxysilane, 3.08 g (5 mol %) of N-(3-(triethoxysilyl)propyl)benzenesulfonamide, and 51.20 g of acetone were placed in a 300 ml flask, and 11.36 g of 0.01 mol/l hydrochloric acid was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and 68.00 g of propylene glycol monomethyl ether acetate was added to the reaction solution to distill off reaction by-products, including methanol, ethanol, acetone, water, and hydrochloric acid, under reduced pressure. After concentration, a propylene glycol monomethyl ether acetate solution of a hydrolysis-condensation product (polymer) was obtained. Propylene glycol monoethyl ether was added to the solution, so that the solvent ratio of propylene glycol monomethyl ether acetate/propylene glycol monoethyl ether was adjusted to 20/80, and the solid residue at 140° C. was adjusted to 20% by weight. The obtained polymer is represented by Formula (5-4), and the weight-average molecular weight determined by GPC was Mw 2,000 in terms of polystyrene.

Synthesis Example 9

11.53 g of silicotungstic acid, 3.48 g of tetraethoxysilane, 4.47 g of methyltriethoxysilane, and 77.95 g of propylene glycol monomethyl ether were placed in a 300 ml flask, and 2.56 g of ultrapure water was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and reaction by-products, including ethanol and water, were distilled off under reduced pressure. After concentration, a propylene glycol monomethyl ether solution of a hydrolysis-condensation product (polymer) was obtained. Propylene glycol monomethyl ether was added to the solution, so that the solid residue at 140° C. was 20% by weight. The obtained polymer was represented by Formula (5-5).

Synthesis Example 10

11.53 g of silicotungstic acid, 11.98 g of tetra-n-butoxy hafnium, and 75.97 g of propylene glycol monomethyl ether were placed in a 300 ml flask, and 5.04 g of concentrated nitric acid (70 wt %) was added dropwise to the mixed solution with stirring by a magnetic stirrer. After that, the flask was placed in an oil bath whose temperature was adjusted to 85° C., and the solution was warmed to reflux for 240 minutes to be reacted. Then, the reaction solution was cooled to a room temperature, and reaction by-products, including ethanol and water, were distilled off under reduced pressure. After concentration, a propylene glycol monomethyl ether solution of a hydrolysis-condensation product (polymer) was obtained. Propylene glycol monomethyl ether was added to the solution, so that the solid residue at 140° C. was 20% by weight. The obtained polymer was represented by Formula (5-6).

(Preparation of Si—Containing Resist Underlayer Film)

The silicon-containing polymer obtained in the synthesis example described above, an acid, a curing catalyst, a sulfonate additive, a solvent, and water were mixed according to the mixing ratio shown in Table 1, and then the mixture was filtrated through a fluororesin filter having a pore size of 0.1 μm to prepare each of the resist underlayer film-forming composition solutions. The addition ratios of the polymers shown in Table 2 represent addition amounts of polymers themselves, and do not represent addition amounts of polymer solutions.

As heteropoly acids in Table 2, (A) refers to silicotungstic acid, (B) refers to phosphotungstic acid, and (C) refers to phosphomolybdic acid.

The abbreviations in Table 2 are explained below: MA is maleic acid, BTEAC is benzyltriethylammonium chloride, IMIDTEOS is N-(3-triethoxysilylpropyl)-4,5-dihydroimidazole, TPSCl is triphenylsulfonium chloride, TPSMA is monotriphenylsulfonium maleate, TPSNO3 is triphenylsulfonium nitrate, TPSTFA is triphenylsulfonium trifluoroacetate, TPSCS is triphenylsulfonium camphorsulfonate, BPS is bisphenylsulfone, PGMEA is propylene glycol monomethyl ether acetate, PGEE is propylene glycol monoethyl ether, and PGME is propylene glycol monomethyl ether. The water used was ultrapure water. Each of the addition amounts is represented by parts by mass.

TABLE 2

| | Heteropoly Acid | Polymer | Acid | Curing Catalyst | Additive | Solvent | | | |
|---|---|---|---|---|---|---|---|---|---|
| Example 12 (Parts by Mass) | (A) 1 | Synthesis Example 5 1 | MA 0.02 | BTEAC 0.006 | | PGME 15 | PGEE 65 | PGMEA 5 | Water 15 |
| Example 13 (Parts by Mass) | (B) 1 | Synthesis Example 5 1 | MA 0.02 | BTEAC 0.006 | | PGME 15 | PGEE 65 | PGMEA 5 | Water 15 |
| Example 14 (Parts by Mass) | (C) 1 | Synthesis Example 5 1 | MA 0.02 | BTEAC 0.006 | | PGME 15 | PGEE 65 | PGMEA 5 | Water 15 |
| Example 15 (Parts by Mass) | (A) 0.2 | Synthesis Example 6 1.8 | MA 0.02 | TPSMA 0.006 | | PGME 15 | PGEE 65 | PGMEA 5 | Water 15 |
| Example 16 (Parts by Mass) | (B) 0.2 | Synthesis Example 6 1.8 | MA 0.02 | TPSMA 0.006 | | PGME 15 | PGEE 65 | PGMEA 5 | Water 15 |
| Example 17 (Parts by Mass) | (C) 0.2 | Synthesis Example 6 1.8 | MA 0.02 | TPSMA 0.006 | | PGME 15 | PGEE 65 | PGMEA 5 | Water 15 |
| Example 18 (Parts by Mass) | (A) 0.2 | Synthesis Example 5 1.8 | MA 0.02 | TPSNO3 0.006 | TPSCS 0.1 | PGME 15 | PGEE 65 | PGMEA 5 | Water 15 |
| Example 19 (Parts by Mass) | (A) 0.2 | Synthesis Example 7 1.8 | MA 0.02 | BTEAC 0.006 | | PGME 15 | PGEE 65 | PGMEA 5 | Water 15 |
| Example 20 (Parts by Mass) | (A) 0.2 | Synthesis Example 8 1.8 | MA 0.02 | BTEAC 0.006 | | PGME 15 | PGEE 65 | PGMEA 5 | Water 15 |
| Example 21 (Parts by Mass) | | Synthesis Example 9 2.0 | MA 0.02 | BTEAC 0.006 | | PGME 15 | PGEE 65 | PGMEA 5 | Water 15 |
| Example 22 (Parts by Mass) | | Synthesis Example 10 2.0 | MA 0 | BTEAC 0.006 | | PGME 15 | PGEE 65 | PGMEA 5 | Water 15 |
| Example 23 (Parts by Mass) | (A) 1.6 | Synthesis Example 5 0.4 | MA 0.02 | BTEAC 0.006 | | PGME 15 | PGEE 65 | PGMEA 5 | Water 15 |
| Example 24 (Parts by Mass) | (A) 0.6 | Synthesis Example 5 1.4 | MA 0.02 | BTEAC 0.006 | | PGME 15 | PGEE 65 | PGMEA 5 | Water 15 |

TABLE 2-continued

| | Heteropoly Acid | Polymer | Acid | Curing Catalyst | Additive | | Solvent | | |
|---|---|---|---|---|---|---|---|---|---|
| Example 25 (Parts by Mass) | (A) 0.1 | Synthesis Example 5 1.9 | MA 0.02 | BTEAC 0.006 | | PGME 15 | PGEE 65 | PGMEA 5 | Water 15 |
| Example 26 (Parts by Mass) | (A) 0.02 | Synthesis Example 5 1.98 | MA 0.02 | BTEAC 0.006 | | PGME 15 | PGEE 65 | PGMEA 5 | Water 15 |
| Comparative Example 3 (Parts by Mass) | | Synthesis Example 6 2 | MA 0.02 | TPSMA 0.006 | TPSCS 0.06 | PGME 15 | PGEE 65 | PGMEA 5 | Water 15 |

(Preparation of Organic Underlayer Film-Forming Composition)

Carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and para-toluenesulfonic acid monohydrate (0.76 g, 0.0040 mol, manufactured by Tokyo Chemical Industry Co., Ltd.) were placed in a 100 mL four-neck flask in a nitrogen gas, and then 1,4-dioxane (6.69 g, manufactured by Kanto Chemical Co., Inc.) was added thereto and stirred. The temperature was raised to 100° C. in order to dissolve the content such that polymerization is initiated. After 24 hours, the content was cooled to 60° C. The content was diluted by adding chloroform (34 g, manufactured by Kanto Chemical Co., Inc.), and was re-precipitated in methanol (168 g, manufactured by Kanto Chemical Co., Inc.). The obtained precipitate was filtrated and dried in a vacuum dryer at 80° C. for 24 hours to obtain 9.37 g of the target polymer (Formula (6-1), hereinafter, abbreviated as PCzFL).

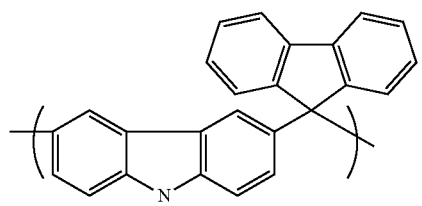

Formula (6-1)

The PCzFL was measured by $^1$H-NMR, and the result is shown below.

$^1$H-NMR (400 MHz, DMSO-$d_6$): δ 7.03-7.55 (br, 12H), δ 7.61-8.10 (br, 4H), δ 11.18 (br, 1H).

The weight-average molecular weight (Mw) of PCzFL determined by GPC was 2,800 in terms of polystyrene, and polydispersity (Mw/Mn) was 1.77.

20 g of the obtained resin was mixed with 3.0 g of tetramethoxymethyl glycoluril (trade name: Powder Link 1174, manufactured by Mitsui Cytec, Ltd.) as a cross-linker, 0.30 g of pyridinium para-toluenesulfonate as a catalyst, and 0.06 g of MEGAFACE R-30 (trade name, manufactured by Dainippon Ink and Chemicals, Incorporated) as a surfactant, and the mixture was dissolved in 88 g of propylene glycol monomethyl ether acetate to prepare a solution. Then, the solution was filtrated through a polyethylene microfilter having a pore size of 0.10 μm, followed by a polyethylene microfilter having a pore size of 0.05 μm to prepare a solution of the organic underlayer film-forming composition used for a multilayer film lithography process.

(Measurement of Optical Constant)

Each of the resist underlayer film-forming compositions, which were prepared in Examples 1 to 26 and Comparative Examples 1 to 3, was applied onto a silicon wafer by using a spinner. The silicon wafer was heated on a hot plate at 200° C. for 1 minute to form the resist underlayer film (having a film thickness of 0.05 μm). For each of these resist underlayer films, a refractive index (the "n" value) and an optical absorption coefficient (the "k" value, also referred to as an attenuation coefficient) at the wavelength of 193 nm were measured by using a spectroscopic ellipsometer (VUV-VASEVU-302 manufactured by J.A. Woollam Co. Inc.).

(Measurement of Dry Etching Rate)

The etcher and etching gas used for measuring a dry etching rate are described below.

ES401 (manufactured by Nippon Scientific Co., Ltd.): $CF_4$

RIE-10NR (manufactured by SAMCO INC.): $O_2$

Each of the solutions of resist underlayer film-forming compositions prepared in Examples 1 to 26 and Comparative Examples 1 to 3 was applied onto a silicon wafer by using a spinner. The silicon wafer was heated on a hot plate at a temperature shown in Table 3 or Table 4 for 1 minute to form each of resist underlayer films having film thicknesses of 0.08 μm (to measure an etching rate with $CF_4$ gas), and to form each of resist underlayer films having film thicknesses of 0.05 μm (to measure an etching rate with $O_2$ gas). Similarly, a silicon wafer was coated with an organic underlayer film-forming composition by using a spinner to form a film (having a film thickness of 0.20 μm). The dry etching rate was measured by using $O_2$ gas as an etching gas, and the result was compared with each of the dry etching rates of resist underlayer films of Examples 1 to 26 and of Comparative Examples 1 to 3.

Table 3 shows the refractive index "n" at the wavelength of 193 nm and the optical absorption coefficient "k" at the wavelength of 193 nm. About Examples 1 to 11 and Comparative Examples 1 and 2, each of etch rates when fluorine-containing gas ($CF_4$ gas) and oxygen-containing gas ($O_2$ gas) was used is shown (an etching rate: nm/minute).

TABLE 3

|  | Baking Temperature | Refractive Index | Optical Absorption Coefficient | Fluorine-Containing Gas Etch Rate (nm/minute) | Oxygen-Containing Gas Etch Rate (nm/minute) |
|---|---|---|---|---|---|
| Example 1 | 400° C. | 1.54 | 0.17 | 23.3 | 1.35 |
| Example 2 | 400° C. | 1.53 | 0.09 | 24.3 | 1.35 |
| Example 3 | 400° C. | 1.55 | 0.38 | 22.3 | 0.46 |
| Example 4 | 400° C. | 1.59 | 0.21 | 25.9 | 0.69 |
| Example 5 | 400° C. | 1.57 | 0.09 | 28.6 | 0.89 |
| Example 6 | 300° C. | 1.78 | 0.32 | 40.0 | 1.90 |
| Example 7 | 300° C. | 1.76 | 0.23 | 39.5 | 3.10 |
| Example 8 | 300° C. | 1.78 | 0.32 | 35.0 | 3.20 |
| Example 9 | 300° C. | 1.76 | 0.24 | 39.7 | 3.10 |
| Example 10 | 300° C. | 1.76 | 0.25 | 39.2 | 3.10 |
| Example 11 | 300° C. | 1.81 | 0.32 | 7.2 | 0.70 |
| Comparative Example 1 | 400° C. | 1.55 | 0.78 | 25.5 | 0.11 |
| Comparative Example 2 | 400° C. | 1.52 | 0.98 | 22.0 | 0.11 |

Table 4 shows the refractive index "n" at the wavelength of 193 nm, the optical absorption coefficient "k" at the wavelength of 193 nm, etch of the etch rates when fluorine-containing gas ($CF_4$ gas) was used (an etching rate is nm/minute), and oxygen-containing gas ($O_2$ gas) resistances as etch rate ratios, that is (the resist underlayer film)/(the organic underlayer film).

TABLE 4

|  | Baking Temperature | Refractive Index | Optical Absorption Coefficient | Fluorine-Containing Gas Etch Rate (nm/minute) | Oxygen-Containing Gas (Ratio to Organic Underlayer Film) |
|---|---|---|---|---|---|
| Example 12 | 240° C. | 1.62 | 0.20 | 32 | 0.00 |
| Example 13 | 240° C. | 1.63 | 0.20 | 40 | 0.01 |
| Example 14 | 240° C. | 1.61 | 0.20 | 54 | 0.01 |
| Example 15 | 240° C. | 1.56 | 0.03 | 39 | 0.02 |
| Example 16 | 240° C. | 1.55 | 0.03 | 42 | 0.02 |
| Example 17 | 240° C. | 1.55 | 0.03 | 44 | 0.02 |
| Example 18 | 240° C. | 1.60 | 0.29 | 39 | 0.02 |
| Example 19 | 240° C. | 1.70 | 0.38 | 43 | 0.02 |
| Example 20 | 240° C. | 1.62 | 0.34 | 40 | 0.02 |
| Example 21 | 240° C. | 1.61 | 0.20 | 35 | 0.01 |
| Example 22 | 240° C. | 1.91 | 0.75 | 40 | 0.01 |
| Example 23 | 240° C. | 1.57 | 0.41 | 40 | 0.00 |
| Example 24 | 240° C. | 1.57 | 0.10 | 30 | 0.02 |
| Example 25 | 240° C. | 1.53 | 0.01 | 25 | 0.02 |
| Example 26 | 240° C. | 1.52 | 0.00 | 25 | 0.02 |
| Comparative Example 3 | 240° C. | 1.69 | 0.24 | 22 | 0.03 |

(Evaluation of Resist Patterning 1)

The obtained organic underlayer film (A layer)-forming composition was applied onto a silicon wafer, and was baked on a hot plate at 400° C. for 60 seconds to obtain the organic underlayer film (A layer). Each of the resist underlayer film (B layer)-forming compositions obtained in Examples 1 to 26 and Comparative Examples 1 to 3 was applied onto the organic underlayer film (A layer), and was baked on a hot plate at a temperature shown in Table 5 or Table 6 for 60 seconds to obtain the resist underlayer film (B layer).

The commercially available photoresist solution (manufactured by JSR Corporation, trade name: AR2772) was applied onto the resist underlayer film (B layer) by using a spinner, and was baked on a hot plate at 110° C. for 60 seconds to form the photoresist film (C layer) having the film thickness of 120 nm. The patterning of the resist was conducted by using the ArF exposure device S-307E (wavelength: 193 nm, NA, σ: 0.85, 0.93/0.85 (Dipole), immersion liquid; water) manufactured by Nikon Corporation. Exposure was conducted through the mask that allows to form a line and space pattern (dense line) in which the line width and the width between the lines of a photoresist are 0.062 μm after development as a target.

Next, baking was conducted on a hot plate at 110° C. for 60 seconds followed by cooling, and then development was conducted with an aqueous solution of concentration of 2.38% by mass tetramethylammonium hydroxide (developing solution) for 60 seconds in the single paddle process. In the skirt shape of the resist pattern after lithography, the rectangle line was evaluated as "straight," the line having wider bottom was evaluated as "footing," the line having narrower bottom was evaluated as "undercut," and the wavy sectional shape of a resist was evaluated as "standing wave."

In the skirt shape of the resist pattern after resist patterning, if lines are rectangle, it is deemed to be good, and if the skirt shape of the resist is worsen, it is deemed to be defective.

TABLE 5

| | (A) layer Baking Temperature | (A) layer Film Thickness | (B) layer Baking Temperature | (B) layer Film Thickness | Shape of Resist |
|---|---|---|---|---|---|
| Example 1 | 400° C. | 90 nm | 400° C. | 35 nm | Straight |
| Example 2 | 400° C. | 90 nm | 400° C. | 40 nm | Straight |
| Example 3 | 400° C. | 90 nm | 400° C. | 20 nm | Straight |
| Example 4 | 400° C. | 90 nm | 400° C. | 30 nm | Straight |
| Example 5 | 400° C. | 90 nm | 400° C. | 40 nm | Straight |
| Example 6 | 400° C. | 90 nm | 300° C. | 15 nm | Straight |
| Example 7 | 400° C. | 90 nm | 300° C. | 20 nm | Straight |
| Example 8 | 400° C. | 90 nm | 300° C. | 15 nm | Straight |
| Example 9 | 400° C. | 90 nm | 300° C. | 20 nm | Straight |
| Example 10 | 400° C. | 90 nm | 300° C. | 20 nm | Straight |
| Example 11 | 400° C. | 90 nm | 300° C. | 20 nm | Straight |
| Comparative Example 1 | 400° C. | 90 nm | 400° C. | 10 nm | Standing Wave |
| Comparative Example 2 | 400° C. | 90 nm | 400° C. | 5 nm | Standing Wave |

TABLE 6

| | (A) layer Baking Temperature | (A) layer Film Thickness | (B) layer Baking Temperature | (B) layer Film Thickness | Shape of Resist |
|---|---|---|---|---|---|
| Example 12 | 400° C. | 200 nm | 400° C. | 45 nm | Straight |
| Example 13 | 400° C. | 200 nm | 400° C. | 45 nm | Straight |
| Example 14 | 400° C. | 200 nm | 400° C. | 45 nm | Straight |
| Example 15 | 400° C. | 200 nm | 400° C. | 45 nm | Straight |
| Example 16 | 400° C. | 200 nm | 400° C. | 45 nm | Straight |
| Example 17 | 400° C. | 200 nm | 400° C. | 45 nm | Straight |
| Example 18 | 400° C. | 200 nm | 400° C. | 45 nm | Straight |
| Example 19 | 400° C. | 200 nm | 400° C. | 45 nm | Straight |
| Example 20 | 400° C. | 200 nm | 400° C. | 45 nm | Straight |
| Example 21 | 400° C. | 200 nm | 400° C. | 45 nm | Straight |
| Example 22 | 400° C. | 200 nm | 400° C. | 45 nm | Straight |
| Example 23 | 400° C. | 200 nm | 400° C. | 45 nm | Straight |
| Example 24 | 400° C. | 200 nm | 400° C. | 45 nm | Straight |
| Example 25 | 400° C. | 200 nm | 400° C. | 45 nm | Straight |
| Example 26 | 400° C. | 200 nm | 400° C. | 45 nm | Straight |
| Comparative Example 3 | 400° C. | 200 nm | 400° C. | 45 nm | Footing |

(Evaluation of Resist Patterning 2)

The obtained organic underlayer film (A layer)-forming composition was applied onto a silicon wafer, and was baked on a hot plate at 400° C. for 60 seconds to obtain the organic underlayer film (A layer). Each of the resist underlayer film (B layer)-forming compositions obtained in Examples 1 to 26 and Comparative Examples 1 and 2 was applied onto the organic underlayer film (A layer), and was baked on a hot plate at a temperature shown in Table 7 or Table 8 for 60 seconds to obtain the resist underlayer film (B layer).

The commercially available photoresist solution (manufactured by Fujifilm Corporation, trade name: FAiRS-9521NT05) was applied onto the resist underlayer film (B layer) by using a spinner, and was heated on a hot plate at 100° C. for 1 minute to form the photoresist film (C layer) having the film thickness of 85 nm.

By using NSR-S307E scanner manufactured by Nikon Corporation (wavelength: 193 nm, NA, σ: 0.85, 0.93/0.85), exposure was conducted through the mask that allows to form a dense line of 0.060 µm-line and space (L/S)=1/1, in which the line width and the width between the lines of a photoresist are become 0.060 µm after development. Then, baking was conducted on a hot plate at 100° C. for 60 seconds followed by cooling, and then development was conducted with butyl acetate (solvent developing solution) for 60 seconds to form a negative-type pattern on the resist underlayer film (B layer). The obtained photoresist patterns were evaluated as good, if large detachment of patterns, undercut, or the line having wider bottom (footing) was not observed ("straight").

TABLE 7

| | (A) layer Baking Temperature | (A) layer Film Thickness | (B) layer Baking Temperature | (B) layer Film Thickness | Shape of Resist |
|---|---|---|---|---|---|
| Example 1 | 400° C. | 90 nm | 400° C. | 35 nm | Straight |
| Example 2 | 400° C. | 90 nm | 400° C. | 40 nm | Straight |
| Example 3 | 400° C. | 90 nm | 400° C. | 20 nm | Straight |
| Example 4 | 400° C. | 90 nm | 400° C. | 30 nm | Straight |
| Example 5 | 400° C. | 90 nm | 400° C. | 40 nm | Straight |
| Example 6 | 400° C. | 90 nm | 300° C. | 15 nm | Straight |
| Example 7 | 400° C. | 90 nm | 300° C. | 20 nm | Straight |
| Example 8 | 400° C. | 90 nm | 300° C. | 15 nm | Straight |
| Example 9 | 400° C. | 90 nm | 300° C. | 20 nm | Straight |
| Example 10 | 400° C. | 90 nm | 300° C. | 20 nm | Straight |
| Example 11 | 400° C. | 90 nm | 300° C. | 20 nm | Straight |
| Comparative Example 1 | 400° C. | 90 nm | 400° C. | 10 nm | Standing Wave |
| Comparative Example 2 | 400° C. | 90 nm | 400° C. | 5 nm | Standing Wave |

TABLE 8

| | (A) layer Baking Temperature | (A) layer Film Thickness | (B) layer Baking Temperature | (B) layer Film Thickness | Shape of Resist |
|---|---|---|---|---|---|
| Example 12 | 400° C. | 200 nm | 400° C. | 45 nm | Straight |
| Example 13 | 400° C. | 200 nm | 400° C. | 45 nm | Straight |
| Example 14 | 400° C. | 200 nm | 400° C. | 45 nm | Straight |
| Example 15 | 400° C. | 200 nm | 400° C. | 45 nm | Straight |
| Example 16 | 400° C. | 200 nm | 400° C. | 45 nm | Straight |
| Example 17 | 400° C. | 200 nm | 400° C. | 45 nm | Straight |
| Example 18 | 400° C. | 200 nm | 400° C. | 45 nm | Straight |
| Example 19 | 400° C. | 200 nm | 400° C. | 45 nm | Straight |
| Example 20 | 400° C. | 200 nm | 400° C. | 45 nm | Straight |
| Example 21 | 400° C. | 200 nm | 400° C. | 45 nm | Straight |
| Example 22 | 400° C. | 200 nm | 400° C. | 45 nm | Straight |
| Example 23 | 400° C. | 200 nm | 400° C. | 45 nm | Straight |
| Example 24 | 400° C. | 200 nm | 400° C. | 45 nm | Straight |
| Example 25 | 400° C. | 200 nm | 400° C. | 45 nm | Straight |
| Example 26 | 400° C. | 200 nm | 400° C. | 45 nm | Straight |

INDUSTRIAL APPLICABILITY

The thin film-forming composition of the present invention can be utilized as resist underlayer film-forming compositions for ArF, KrF photoresists and the like; resist underlayer film-forming compositions for EUV resists and the like; resist underlayer film-forming compositions for electron beam resists and the like; and reverse material-forming compositions and the like.

The invention claimed is:

1. A resist underlayer film obtained by applying a resist underlayer film-forming composition onto a semiconductor substrate, and then baking the applied resist underlayer film-forming composition, wherein the resist underlayer film-forming composition comprises:
   (A) component: an isopoly acid or a heteropoly acid, or a salt thereof, or a combination thereof; and
   (B) component: polysiloxan, poly hafnium oxide or zirconium oxide, or a combination thereof, wherein an amount of the (A) component is 0.1 to 85% by mass of a total amount of the (A) component and the (B) component; and the polysiloxan is a hydrolysis-condensation product of hydrolyzable silane of Formula (1):

$$R^1{}_a R^2{}_b Si(R^3)_{4-(a+b)} \quad \text{Formula (1)}$$

wherein:
R$^1$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and R$^1$ binds to a silicon atom with a Si—C bond;

R$^2$ is a nitrogen atom-containing ring or an organic group containing the nitrogen atom-containing ring, a condensed aromatic ring or an organic group containing the condensed aromatic ring, a protected phenolic hydroxyl group or an organic group containing the protected phenolic hydroxyl group, or a bisaryl group or an organic group containing the bisaryl group, and R$^2$ binds to a silicon atom with a Si—C bond;

R$^3$ is an alkoxy group, an acyloxy group, or a halogen group;

a is an integer of 0 to 3;
b is an integer of 0 to 3;
(a+b) is an integer of 0 to 3; and
a hydrolyzable silane whose (a+b) is 0 is contained in a proportion of 60 to 85 mol % of a total hydrolyzable silane in Formula (1);

the poly hafnium oxide is a hydrolysis-condensation product of hydrolyzable hafnium of Formula (2):

$$Hf(R^4)_4 \quad \text{Formula (2)}$$

wherein R$^4$ is an alkoxy group, an acyloxy group, or a halogen group; and the zirconium oxide is a hydrolysis-condensation product of hydrolyzable zirconium of Formula (3) or Formula (4):

$$Zr(R^5)_4 \quad \text{Formula (3)}$$

$$ZrO(R^6)_2 \quad \text{Formula (4)}$$

wherein each of R$^5$ and R$^6$ is an alkoxy group, an acyloxy group, a halogen group, or a nitrate ion, or a hydrolysis-condensation product of a combination thereof.

2. The resist underlayer film obtained by applying a resist underlayer film-forming composition according to claim 1, wherein the isopoly acid is an oxoacid of tungsten, molybdenum, or vanadium, or a salt thereof.

3. The resist underlayer film obtained by applying a resist underlayer film-forming composition according to claim 1, wherein the isopoly acid is metatungstic acid or ammonium metatungstate.

4. The resist underlayer film obtained by applying a resist underlayer film-forming composition according to claim 1, wherein the heteropoly acid is a combination of an oxoacid of tungsten, molybdenum, or vanadium, or a salt thereof and an oxoacid of silicon or phosphorus, or a salt thereof.

5. The resist underlayer film obtained by applying a resist underlayer film-forming composition according to claim 1, wherein the heteropoly acid is silicotungstic acid, phosphotungstic acid, or phosphomolybdic acid.

6. The resist underlayer film obtained by applying a resist underlayer film-forming composition according to claim 1, wherein the composition further comprises an acid.

7. The resist underlayer film obtained by applying a resist underlayer film-forming composition according to claim 1, wherein the composition further comprises water.

8. A method for manufacturing a semiconductor device comprising:
forming a resist underlayer film by applying a resist underlayer film-forming composition onto a semiconductor substrate, and then baking the applied resist underlayer film-forming composition;
forming a resist film by applying a composition for resists onto the resist underlayer film; exposing the resist film;
obtaining a resist pattern by developing the exposed resist film;
etching the resist underlayer film with the resist pattern; and
processing the semiconductor substrate with a patterned resist underlayer film,
wherein the resist underlayer film-forming composition comprises:
(A) component: an isopoly acid or a heteropoly acid, or a salt thereof, or a combination thereof; and
(B) component: polysiloxan, poly hafnium oxide or zirconium oxide, or a combination thereof, wherein an amount of the (A) component is 0.1 to 85% by mass of a total amount of the (A) component and the (B) component; and
the polysiloxan is a hydrolysis-condensation product of hydrolyzable silane of Formula (1):

$$R^1{}_a R^2{}_b Si(R^3)_{4-(a+b)} \quad \text{Formula (1)}$$

wherein:
R$^1$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and R$^1$ binds to a silicon atom with a Si—C bond;

R$^2$ is a nitrogen atom-containing ring or an organic group containing the nitrogen-atom containing ring, a condensed aromatic ring or an organic group containing the condensed aromatic ring, a protected phenolic hydroxyl group or an organic group containing the protected phenolic hydroxyl group, or a bisaryl group or an organic group containing the bisaryl group, and R$^2$ binds to a silicon atom with a Si—C bond;

R$^3$ is an alkoxy group, an acyloxy group, or a halogen group;

a is an integer of 0 to 3;
b is an integer of 0 to 3;
(a+b) is an integer of 0 to 3; and
a hydrolyzable silane whose (a+b) is 0 is contained in a proportion of 60 to 85 mol % of a total hydrolyzable silane in Formula (1):

the poly hafnium oxide is a hydrolysis-condensation product of hydrolyzable hafnium of Formula (2):

$$Hf(R^4)_4 \quad \text{Formula (2)}$$

wherein R$^4$ is an alkoxy group, an acyloxy group, or a halogen group; and
the zirconium oxide is a hydrolysis-condensation product of hydrolyzable zirconium of Formula (3) or Formula (4):

$$Zr(R^5)_4 \quad \text{Formula (3)}$$

$$ZrO(R^6)_2 \quad \text{Formula (4)}$$

wherein each of $R^5$ and $R^6$ is an alkoxy group, an acyloxy group, a halogen group, or a nitrate ion, or a hydrolysis-condensation product of a combination thereof.

9. A method for manufacturing a semiconductor device comprising:
   forming an organic underlayer film on a semiconductor substrate;
   forming a resist underlayer film by applying a resist underlayer film-forming composition onto the organic underlayer film, and then baking the applied resist underlayer film-forming composition;
   forming a resist film by applying a composition for resists onto the resist underlayer film;
   exposing the resist film;
   obtaining a resist pattern by developing the exposed resist film;
   etching the resist underlayer film with the resist pattern;
   etching the organic underlayer film with the patterned resist underlayer film; and
   processing the semiconductor substrate with the patterned organic underlayer film,
   wherein the resist underlayer film-forming composition comprises:
   (A) component: an isopoly acid or a heteropoly acid, or a salt thereof, or a combination thereof; and
   (B) component: polysiloxan, poly hafnium oxide or zirconium oxide, or a combination thereof, wherein
   an amount of the (A) component is 0.1 to 85% by mass of a total amount of the (A) component and the (B) component; and
   the polysiloxan is a hydrolysis-condensation product of hydrolyzable silane of Formula (1):

$$R^1{}_a R^2{}_b Si(R^3)_{4-(a+b)} \quad \text{Formula (1)}$$

wherein:
   $R^1$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and $R^1$ binds to a silicon atom with a Si—C bond;
   $R^2$ is a nitrogen atom-containing ring or an organic group containing the nitrogen atom-containing ring, a condensed aromatic ring or an organic group containing the condensed aromatic ring, a protected phenolic hydroxyl group or an organic group containing the protected phenolic hydroxyl group, or a bisaryl group or an organic group containing the bisaryl group, and $R^2$ binds to a silicon atom with a Si—C bond;
   $R^3$ is an alkoxy group, an acyloxy group, or a halogen group;
   a is an integer of 0 to 3;
   b is an integer of 0 to 3;
   (a+b) is an integer of 0 to 3; and
   a hydrolyzable silane whose (a+b) is 0 is contained in a proportion of 60 to 85 mol % of a total hydrolyzable silane in Formula (1);
   the poly hafnium oxide is a hydrolysis-condensation product of hydrolyzable hafnium of Formula (2):

$$Hf(R^4)_4 \quad \text{Formula (2)}$$

wherein $R^4$ is an alkoxy group, an acyloxy group, or a halogen group; and
   the zirconium oxide is a hydrolysis-condensation product of hydrolyzable zirconium of Formula (3) or Formula (4):

$$Zr(R^5)_4 \quad \text{Formula (3)}$$

$$ZrO(R^6)_2 \quad \text{Formula (4)}$$

wherein each of $R^5$ and $R^6$ is an alkoxy group, an acyloxy group, a halogen group, or a nitrate ion, or a hydrolysis-condensation product of a combination thereof.

* * * * *